US011079628B2

(12) United States Patent
Yamada et al.

(10) Patent No.: US 11,079,628 B2
(45) Date of Patent: Aug. 3, 2021

(54) LIGHT EMITTING DEVICE HAVING LUMINOUS FLUX CONTROL MEMBER WITH RECESS RADIALLY DISTANT FROM A LIGHT INCIDENT SURFACE

(71) Applicant: Enplas Corporation, Saitama (JP)

(72) Inventors: Kyouhei Yamada, Saitama (JP); Masayo Takizawa, Saitama (JP)

(73) Assignee: Enplas Corporation, Saitama (JP)

( * ) Notice: Subject to any disclaimer, the term of this patent is extended or adjusted under 35 U.S.C. 154(b) by 0 days.

(21) Appl. No.: 16/640,379

(22) PCT Filed: Aug. 15, 2018

(86) PCT No.: PCT/JP2018/030371
§ 371 (c)(1),
(2) Date: Feb. 20, 2020

(87) PCT Pub. No.: WO2019/039366
PCT Pub. Date: Feb. 28, 2019

(65) Prior Publication Data
US 2021/0072596 A1    Mar. 11, 2021

(30) Foreign Application Priority Data

Aug. 22, 2017  (JP) .............................. JP2017-159739
Aug. 9, 2018   (JP) .............................. JP2018-150228

(51) Int. Cl.
*F21V 5/04*       (2006.01)
*G02F 1/13357*    (2006.01)
*G02F 1/1335*     (2006.01)

(52) U.S. Cl.
CPC .. *G02F 1/133606* (2013.01); *G02F 1/133605* (2013.01); *G02F 1/133609* (2013.01); *G02F 1/133603* (2013.01); *G02F 1/133607* (2021.01)

(58) Field of Classification Search
CPC ... F21V 5/046; F21V 5/04; F21V 5/02; G02B 2003/0093; G02B 3/08
See application file for complete search history.

(56) References Cited

U.S. PATENT DOCUMENTS 6,582,103 B1 *  6/2003  Popovich ................ F21V 5/046
                                                    362/307
7,118,236 B2 * 10/2006  Hahm ..................... H01L 33/58
                                                    362/23.1
(Continued)

FOREIGN PATENT DOCUMENTS

JP    2009-044016    2/2009
JP    2015-181131    10/2015
(Continued)

OTHER PUBLICATIONS

International Search Report dated Oct. 30, 2018 From the International Searching Authority Re. Application No. PCT/JP2018/030371 and Its Translation Into English.

*Primary Examiner* — Ismael Negron

(57) ABSTRACT

A light emitting device has a light emitter defining an optical axis; and a luminous flux control member with an incident surface in a back surface and intersecting the optical axis, a reflection surface opposite the back surface, an emission surface connecting the back surface to the reflection surface, and a first recessed portion formed on the back surface farther from the optical axis than the incident surface and having a first inclined surface closer to the reflection surface with increasing distance from the optical axis, a front end of the first inclined surface such that a substantial portion of light emitted from the center region of the light emitter and reflected by the reflection surface do not strike the first inclined surface, and such that a substantial portion of light (Continued)

emitted from the light emitter and not reflected by the reflection surface strikes the first inclined surface.

10 Claims, 16 Drawing Sheets

(56) References Cited

U.S. PATENT DOCUMENTS

| | | | | |
|---|---|---|---|---|
| 7,142,769 B2* | 11/2006 | Hsieh | ................ | G02B 6/0033 385/146 |
| 7,347,590 B2* | 3/2008 | Lee | ................ | G02B 19/0071 362/327 |
| 7,387,399 B2* | 6/2008 | Noh | ................ | G02B 6/0018 257/100 |
| 7,401,963 B2* | 7/2008 | Stefanov | ................ | G02B 6/0018 362/620 |
| 7,540,635 B2* | 6/2009 | Kim | ................ | G02B 19/0071 362/308 |
| 7,566,148 B2* | 7/2009 | Noh | ................ | H01L 33/54 362/305 |
| 7,582,915 B2* | 9/2009 | Hsing Chen | ................ | H01L 33/60 257/98 |
| 7,959,328 B2* | 6/2011 | Wanninger | ................ | G02B 19/0028 362/309 |
| 8,633,641 B2* | 1/2014 | Lin | ................ | F21V 5/04 313/327 |
| 8,814,391 B2* | 8/2014 | Koh | ................ | G02B 6/0046 362/311.02 |
| 9,482,854 B2* | 11/2016 | Kim | ................ | G02B 19/0028 |
| 9,488,864 B2* | 11/2016 | Tran | ................ | G02B 17/00 |
| 10,007,050 B2* | 6/2018 | Yamada | ................ | G02B 6/0045 |
| 2021/0063819 A1* | 3/2021 | Cho | ................ | G02F 1/133605 |

FOREIGN PATENT DOCUMENTS

| | | |
|---|---|---|
| JP | 2015-197624 | 11/2015 |
| JP | 2016-058310 | 4/2016 |
| WO | WO 2012/132043 | 10/2012 |
| WO | WO 2019/039366 | 2/2019 |

* cited by examiner

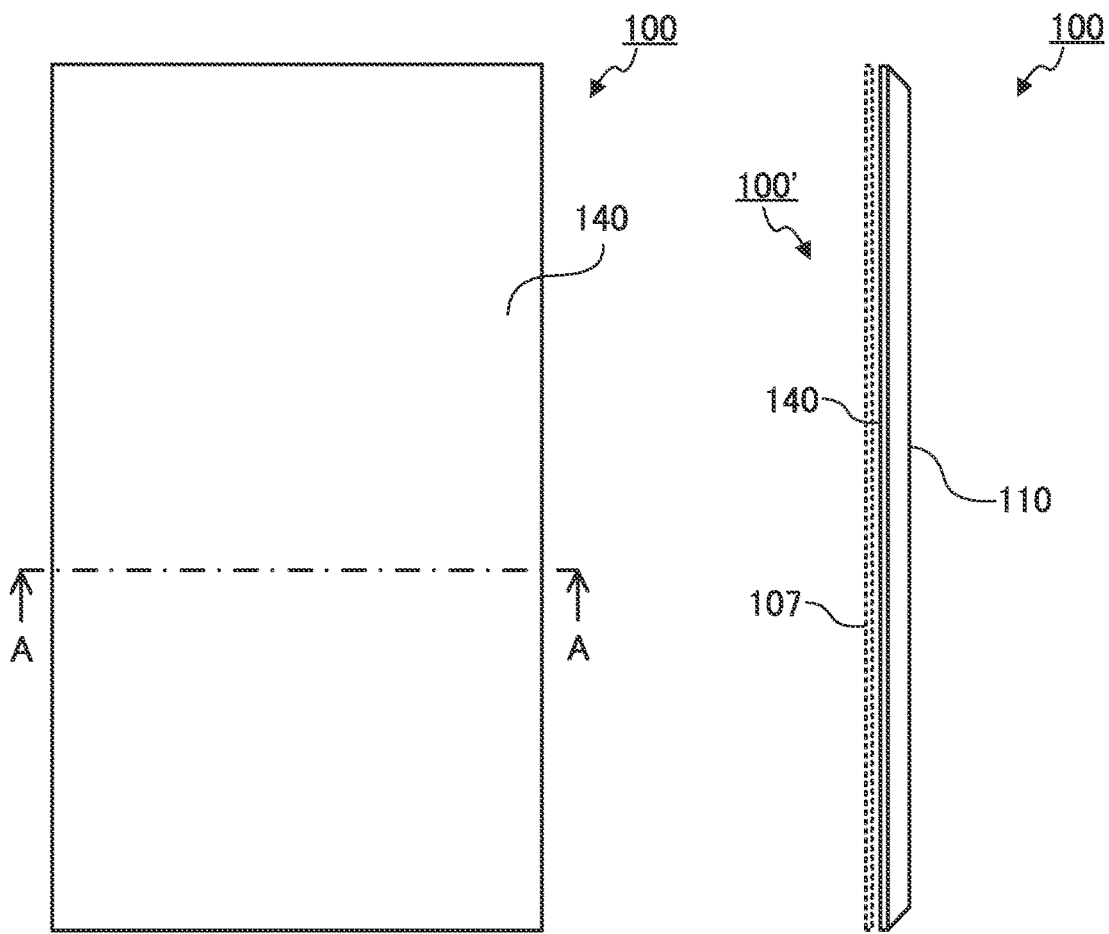
FIG. 2A
FIG. 2B
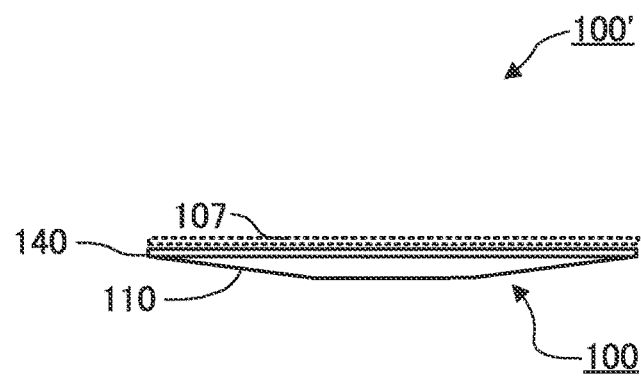
FIG. 2C

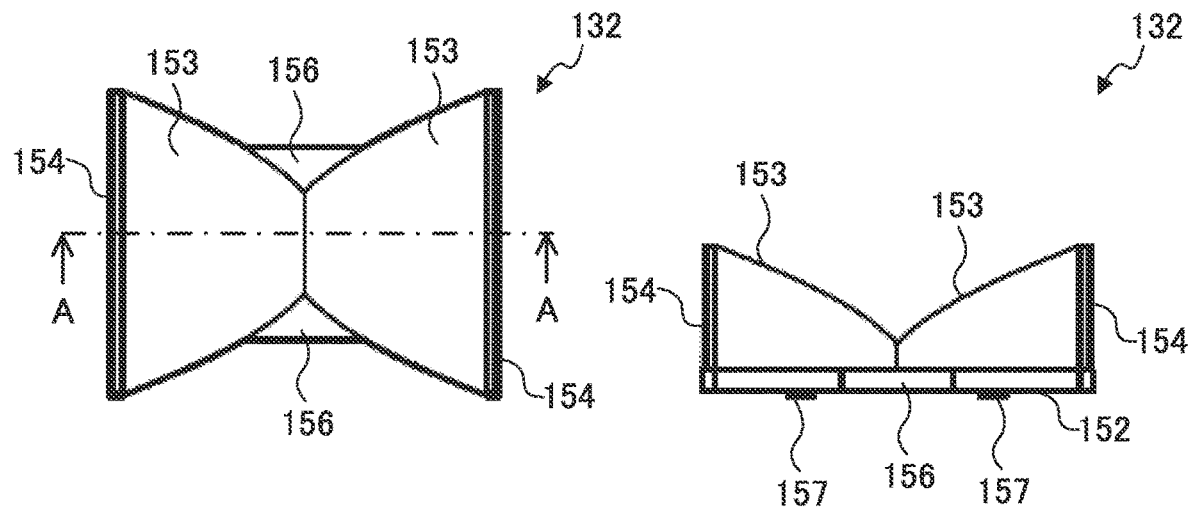
FIG. 4A
FIG. 4B
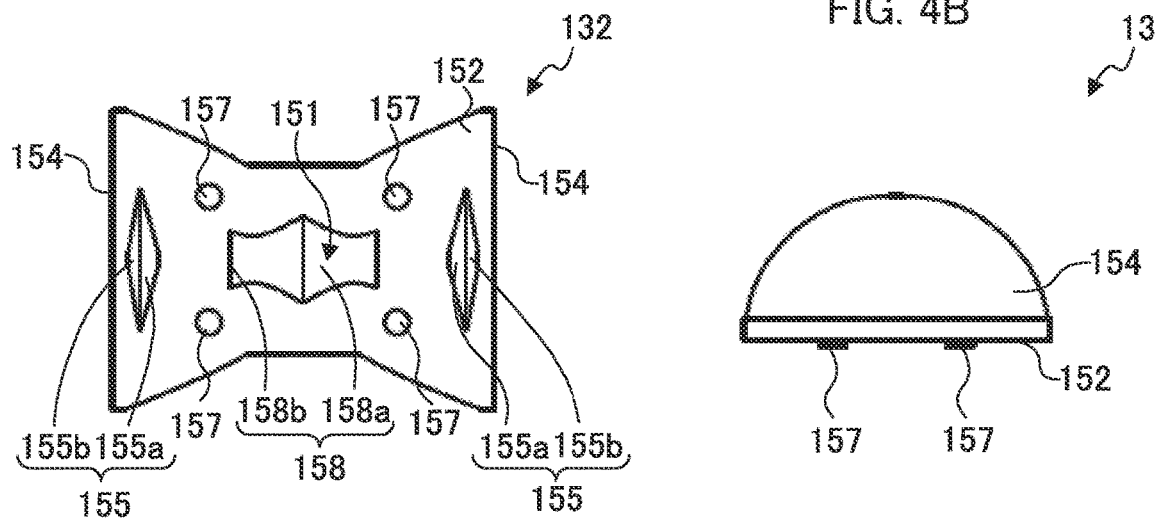
FIG. 4C
FIG. 4D
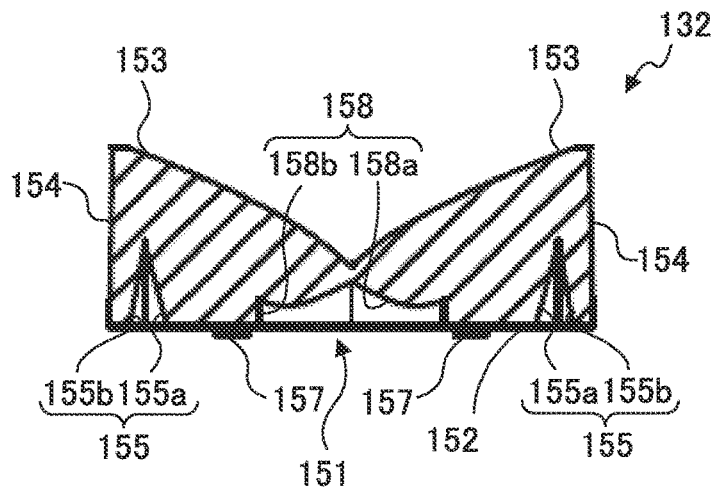
FIG. 4E

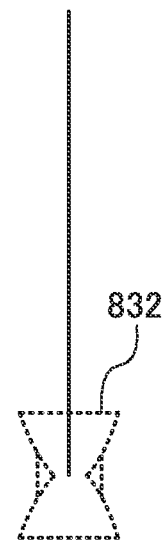 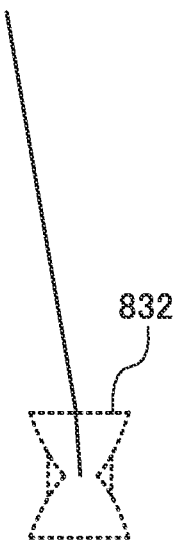 
FIG. 14A　　　　　FIG. 14B　　　　　FIG. 14C
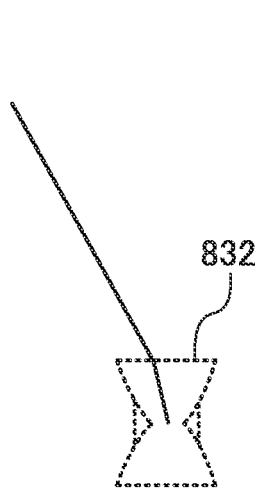 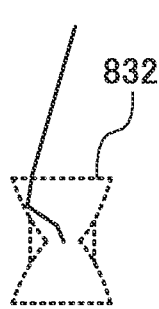  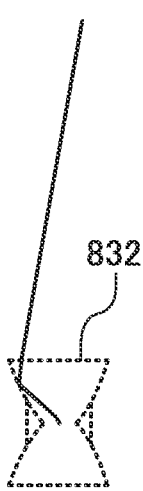
FIG. 14D　　　FIG. 14E　　　FIG. 14F　　　FIG. 14G

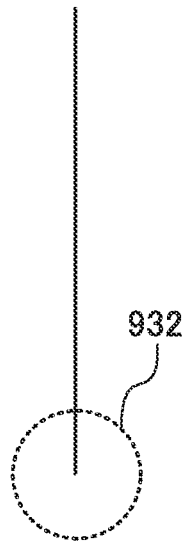 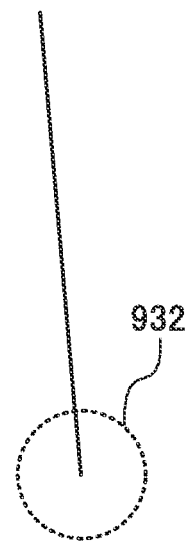 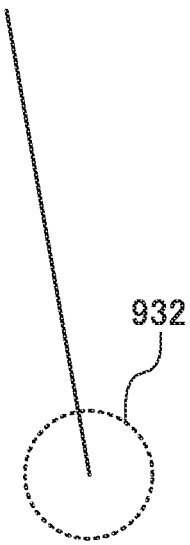
FIG. 15A   FIG. 15B   FIG. 15C
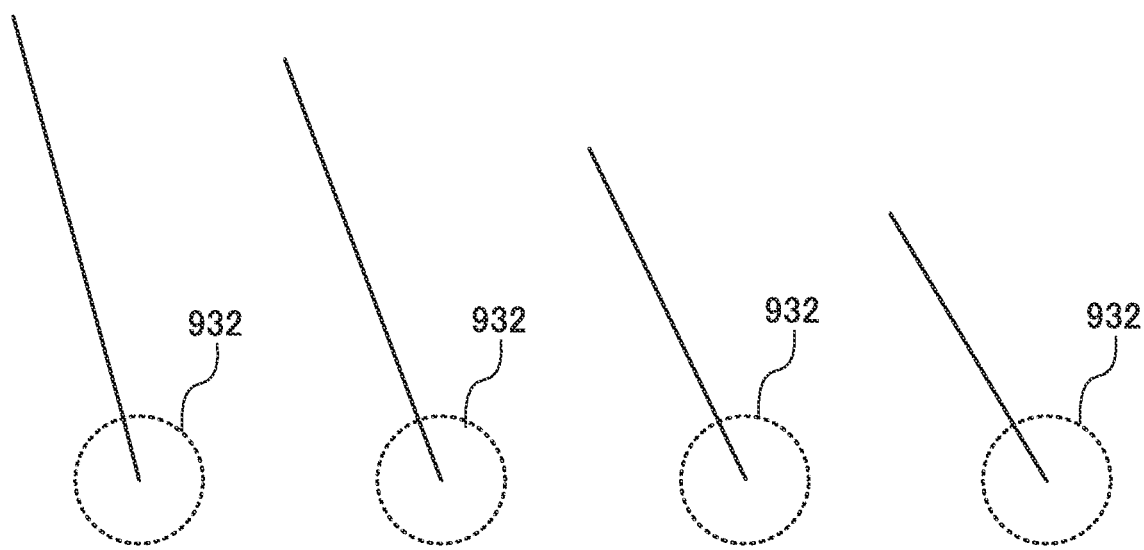
FIG. 15D   FIG. 15E   FIG. 15F   FIG. 15G

US 11,079,628 B2

LIGHT EMITTING DEVICE HAVING LUMINOUS FLUX CONTROL MEMBER WITH RECESS RADIALLY DISTANT FROM A LIGHT INCIDENT SURFACE

TECHNICAL FIELD

The present invention relates to a light-emitting device, a surface light source device and a light flux controlling member.

BACKGROUND ART

Some transmitting image display apparatuses such as liquid crystal display apparatuses use a direct surface light source device as a backlight. In recent years, direct surface light source devices including a plurality of light-emitting elements as the light source have been used.

For example, a direct surface light source device includes a substrate, a plurality of light-emitting elements, a plurality of light flux controlling members (lenses) and a light diffusion member. Each of the light-emitting elements is, for example, a light-emitting diode (LED) such as a white light-emitting diode. The light-emitting elements are disposed in a matrix (e.g., in a plurality of lines of the light-emitting elements) on the substrate. A light flux controlling member configured to expand, in the plane direction of the substrate, the light emitted from each light-emitting element is disposed over each light-emitting element (see, for example, PTL 1). The light emitted from the light flux controlling member is diffused by the light diffusion member so as to illuminate an illumination target member (e.g., a liquid crystal panel) in a planar fashion.

FIG. 1 illustrates a configuration of an optical module (light-emitting device) disclosed in PTL 1. As illustrated in FIG. 1, the optical module disclosed in PTL 1 includes light-emitting element 40 and light direction conversion device 10 (light flux controlling member). Light direction conversion device 10 includes light incidence surfaces 12b and 12c configured to allow incidence of light emitted from light-emitting element 40, light reflection surface 12d configured to totally reflect light entered from light incidence surfaces 12b and 12c, and light emission surface 12e configured to laterally emit light reflected by light reflection surface 12d. In the optical module disclosed in PTL 1, light direction conversion device 10 is formed with a transparent resin containing light diffusion agent 14, and thus light is partially emitted from light reflection surface 12d so as to increase the uniformity of the luminance of light emitted from light direction conversion device 10.

In recent years, to manufacture a large surface light source device at low cost, it is desired to reduce the number of light-emitting elements (e.g., the number of lines of light-emitting elements). In other words, it is desired to deliver light to corners of the surface light source device even in the case where the number of the lines of the light-emitting elements is reduced. As such, it is desired that the light flux controlling member deliver light emitted from light-emitting element as far as possible.

CITATION LIST

Patent Literature

PTL 1
Japanese Patent Application Laid-Open No. 2015-181131

SUMMARY OF INVENTION

Technical Problem

However, in the optical module disclosed in PTL 1, a large quantity of light is emitted upward from light reflection surface 12d and a large quantity of light is emitted downward from light emission surface 12e. The light emitted downward from light emission surface 12e is diffusely reflected by the surface of the reflection surface of the inner bottom surface of the surface light source device or the substrate near light emission surface 12e, and thus the light is directed upward. Consequently, in the optical module disclosed in PTL 1, the quantity of light that reaches a remote region from light-emitting element 40 is small, and the luminance of the region near light direction conversion device 10 is high, thus easily causing luminance unevenness.

In addition, in recent years it is desired that a light flux controlling member in a surface light source device have light distribution characteristics (anisotropic light distribution characteristics) that expand light in the longitudinal direction (the opposite directions of two light emission surfaces 12e) to deliver light to the corners, even with a reduced number of light-emitting elements (or even with a reduced number of lines of a plurality of light-emitting elements). However, when the light is excessively expanded in the longitudinal direction (when excessive anisotropic light distribution characteristics are provided), light is less expanded in the short direction (the extending direction of light emission surface 12e). Consequently, light is less delivered to the four corners of the surface light source device, and luminance unevenness between the center portion and the four corners of the surface light source device is easily caused.

An object of the present invention is to provide a light-emitting device that can reduce luminance unevenness due to light emitted downward from the emission surface, and can deliver light to a remote region. More preferably, an object of the present invention is to provide a light-emitting device that can reduce the luminance unevenness between a center portion and a corner of the surface light source device while maintaining the light distribution characteristics.

In addition, another object of the present invention is to provide a surface light source device including the above-mentioned light-emitting device, and a light flux controlling member used for the light-emitting device.

Solution to Problem

A light-emitting device of an embodiment of the present invention includes: a light-emitting element; and a light flux controlling member configured to control a distribution of light emitted from the light-emitting element, wherein the light flux controlling member includes an incidence surface disposed on a rear side to intersect an optical axis of the light-emitting element, the incidence surface being configured to allow incidence of the light emitted from the light-emitting element, a rear surface extending radially outward from an outer edge of the incidence surface, the rear surface surrounding the incidence surface, a reflection surface disposed on a front side opposite to the rear surface, the reflection surface being configured to reflect light entered from the incidence surface, an emission surface disposed to connect the rear surface and the reflection surface, the emission surface being configured to emit, to outside, the light entered from the incidence surface, and a first recess that is open at the rear surface, the first recess being farther from the optical axis than the incidence surface. The first recess includes a first inclined surface that is inclined such that the first inclined surface comes closer to the front side with increasing distance from the optical axis. In a direction along the optical axis, a front end of the first inclined surface is located on the rear side relative to light that is emitted from a center of a light-emitting surface of the light-emitting element and entered from the incidence surface so as to be reflected by the reflection surface toward the emission surface, the front end being located on the front side relative to light that is emitted from an end portion of the light-emitting surface of the light-emitting element and entered from the incidence surface so as to be directly advanced toward the emission surface not by way of the reflection surface.

A surface light source device of an embodiment of the present invention includes: a plurality of the light-emitting devices; and a light diffusion plate configured to allow the light emitted from the light-emitting device of the embodiment of the present invention to pass through the light diffusion plate while diffusing the light emitted from the light-emitting device.

A display device of an embodiment of the present invention includes: the surface light source device; and a display member configured to be irradiated with light emitted from the surface light source device of the embodiment of the present invention.

A light flux controlling member of an embodiment of the present invention is used for the light-emitting device of the embodiment of the present invention.

Advantageous Effects of Invention

According to the present invention, it is possible to provide a light-emitting device that can reduce luminance unevenness due to light emitted downward from the emission surface, and can deliver light to a remote region.

BRIEF DESCRIPTION OF DRAWINGS

FIGS. 2A, 2B and 2C illustrate a configuration of a surface light source device according to Embodiment 1;

FIGS. 4A, 4B, 4C, 4D and 4E illustrate a configuration of a light flux controlling member according to Embodiment 1;

FIGS. 14A, 14B, 14C, 14D, 14E, 14F and 14G illustrate light paths in a light-emitting device including the light flux controlling member of Modification 3;

FIGS. 15A, 15B, 15C, 15D, 15E, 15F and 15G illustrate light paths in a light-emitting device including the light flux controlling member of Modification 4.

DESCRIPTION OF EMBODIMENTS

Embodiments of the present invention are elaborated below with reference to the accompanying drawings.

Embodiment 1

Configuration of Surface Light Source Device

Figure 1:
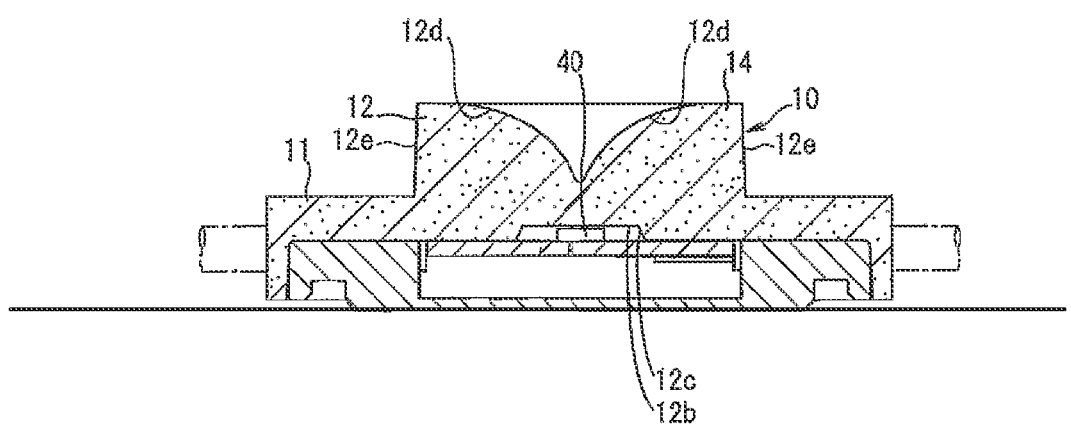
FIG. 1 illustrates a configuration of a known light-emitting device.
Figure 3A:
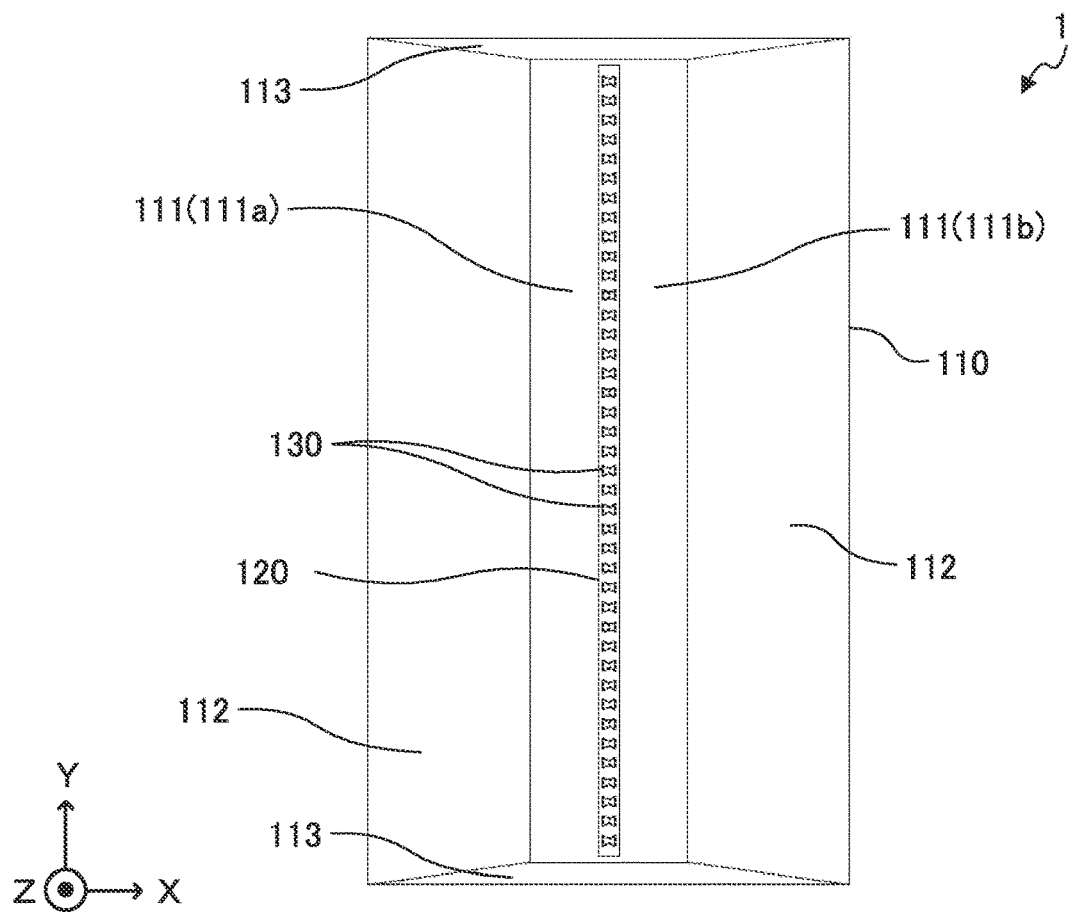
FIGS. 3A and 3B illustrate a configuration of the surface light source device according to Embodiment 1.
Figure 3B:
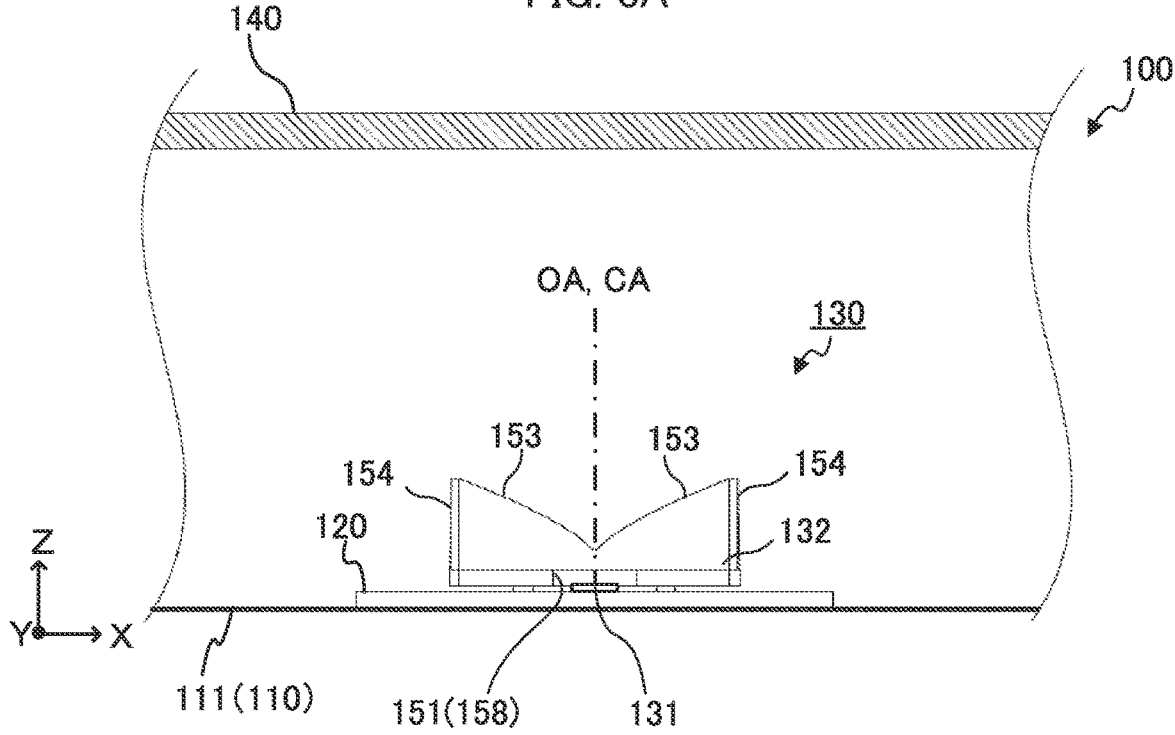

FIGS. 2A to 3B illustrate a configuration of surface light source device 100 according to Embodiment 1. FIG. 2A is a plan view of surface light source device 100, FIG. 2B is a side view of surface light source device 100, and FIG. 2C is a front view of surface light source device 100. FIG. 3A is a plan view including a state where light diffusion member 140 is removed in FIG. 2A, and FIG. 3B is a partially enlarged sectional view taken along line A-A of FIG. 2A. Light diffusion member 140 includes a light diffusion plate and an optical sheet.

As illustrated in FIGS. 2A to 3B, surface light source device 100 includes housing 110, substrate 120, a plurality of light-emitting devices 130 and light diffusion plate 140. In addition, as illustrated in FIGS. 2B and 2C, when combined with a display member (irradiation target member) 107 (illustrated with dotted lines in FIGS. 2B and 2C) such as a liquid crystal panel, surface light source device 100 can be used as display device 100'.

Housing 110 is a box that is at least partially open for housing therein substrate 120 and light-emitting devices 130. Housing 110 includes horizontal surface 111, two first inclined surfaces 112 inclined toward to light diffusion plate 140 with horizontal surface 111 therebetween, and two second inclined surfaces 113 connecting horizontal surface 111 and two first inclined surfaces 112. Two first inclined surfaces 112 and two second inclined surfaces 113 can reflect, toward light diffusion plate 140, light substantially horizontally emitted from light-emitting device 130, such that light emitted from light-emitting device 130 is easily collected at light diffusion plate 140. The inclination angle of first inclined surface 112 to horizontal surface 111 is 6 to 9°, and the inclination angle of second inclined surface 113 to horizontal surface 111 is 40 to 50°.

A part of horizontal surface 111 (first horizontal surface 111a) on one first inclined surface 112 side relative to light-emitting device 130 may be inclined in the direction opposite the one first inclined surface 112. In addition, a part of horizontal surface 111 (second horizontal surface 111b) on the other first inclined surface 112 side relative to light-emitting device 130 may be inclined in the direction opposite the other first inclined surface 112. In other words, the inclinations of two first inclined surfaces 112 are set such that the normals to two first inclined surfaces 112 intersect each other on the front side of surface light source device 100, whereas the inclinations of first horizontal surface 111a and second horizontal surface 111b are set such that the normals to first horizontal surface 111a and second horizontal surface 111b intersect each other on the rear side of surface light source device 100. With such a configuration, excessive increase in brightness in the region around light-emitting device 130 can be suppressed.

With housing 110 having the above-described shape, the thickness of the appearance of surface light source device 100 can be reduced. The size of the opening of housing 110 corresponds to the size of the light emission region formed in light diffusion plate 140, and is 400 mm×700 mm (32 inch), for example. The opening is sealed with light diffusion plate 140. The height (space thickness) from the surface of horizontal surface 111 to light diffusion plate 140 is, but not limited to, about 10 to 40 mm. Housing 110 is composed of a resin such as polymethylmethacrylate (PMMA) and polycarbonate (PC), a metal such as stainless steel and aluminum, or the like, for example.

Substrate 120 is a flat plate that is disposed on horizontal surface 111 of housing 110 and is configured for disposing light-emitting devices 130 inside housing 110 at a predetermined interval. The surface of substrate 120 reflects, toward light diffusion plate 140, light arriving from light-emitting device 130.

Light-emitting devices 130 are disposed in a line on substrate 120. The number of light-emitting devices 130 disposed on substrate 120 is not limited. The number of light-emitting devices 130 disposed on substrate 120 is appropriately set based on the size of the light emission region (light-emitting surface) defined by the opening of housing 110.

Each light-emitting device 130 includes light-emitting element 131 and light flux controlling member 132. Each light-emitting device 130 is disposed such that the optical axis of light emitted from light-emitting element 131 (optical axis OA of light-emitting element 131, described later) is aligned with the normal to the surface of substrate 120.

Light-emitting element 131 is the light source of surface light source device 100 (and light-emitting device 130). Light-emitting element 131 is disposed on substrate 120. Light-emitting element 131 is a light-emitting diode (LED), for example. The color of light emitted from light-emitting element 131 may be appropriately set. The color of light emitted from light-emitting element 131 may be white or blue. In the present embodiment, the color of light emitted from light-emitting element 131 is white.

Light flux controlling member 132 controls the distribution of light emitted from light-emitting element 131. Light flux controlling member 132 is disposed on light-emitting element 131 such that central axis CA of light flux controlling member 132 is aligned with optical axis OA of light-emitting element 131 (see FIG. 3B). The "optical axis OA of light-emitting element 131" means a central light beam of a stereoscopic emission light flux of light-emitting element 131. The "central axis CA of light flux controlling member 132" means a symmetric axis of 2-fold rotational symmetry, for example.

In the following description, with respect to each light-emitting device 130, the Z axis is an axis that extends parallel to optical axis OA of light-emitting element 131 from the light emission center of light-emitting element 131 as its origin, the Y axis is an axis that extends parallel to the arrangement direction of light-emitting devices 130 in a virtual plane that is orthogonal to the Z axis and includes the light emission center of light-emitting element 131, and X axis is an axis that is orthogonal to the Y axis in the virtual plane. In addition, a first virtual cross-section is a cross-section of light-emitting device 130 taken along a first virtual plane (XZ plane) including optical axis OA and the X axis, a second virtual cross-section is a cross-section taken along a second virtual plane including optical axis OA and the Y axis (YZ plane), and a third virtual cross-section is a cross-section taken along a third virtual plane including the X axis and the Y axis (XY plane). In Embodiment 1, light flux controlling member 132 is plane-symmetrical about the first virtual plane (XZ plane) and the second virtual plane (YZ plane). In addition, light flux controlling member 132 is a part of an article that is substantially rotationally symmetrical about the X axis as the rotation axis.

The material of light flux controlling member 132 is not limited as long as light of a desired wavelength can pass therethrough. Examples of the material of light flux controlling member 132 include: optically transparent resins such as polymethylmethacrylate (PMMA), polycarbonate (PC), and epoxy resin (EP); and glass. A main feature of surface light source device 100 according to Embodiment 1 is the configuration of light flux controlling member 132. Therefore, light flux controlling member 132 will be elaborated later.

Light diffusion plate 140 is disposed in such a manner as to close the opening of housing 110. Light diffusion plate 140 is an optically transparent, light diffusing plate-shaped member, and allows light emitted from emission surface 154 of light flux controlling member 132 to pass therethrough while diffusing the light. Light diffusion plate 140 may serve as a light-emitting surface of surface light source device 100, for example.

The material of light diffusion plate 140 may be any material that can allow, to pass therethrough, light emitted from to emission surface 154 of light flux controlling member 132 while diffusing the light. Examples of the material of light diffusion plate 140 include optically transparent resins such as polymethylmethacrylate (PMMA), polycarbonate (PC), polystyrene (PS), and styrene-methylmethacrylate copolymerization resin (MS). To provide light diffusing characteristics, fine irregularities are formed in the surface of light diffusion plate 140, or light diffusion members such as beads are dispersed inside light diffusion plate 140.

In surface light source device 100 according to Embodiment 1, light emitted from each light-emitting element 131 is emitted by light flux controlling member 132 such that the light illuminates a wide range of light diffusion plate 140, or more specifically, light is changed to travel in opposite two directions (along the X-axis direction in FIG. 3A) substantially perpendicular to optical axis OA of light-emitting element 131. Light emitted from each light flux controlling member 132 is further diffused by light diffusion plate 140, and emitted to the outside. Thus, surface light source device 100 can reduce luminance unevenness.

Configuration of Light Flux Controlling Member

FIGS. 4A to 4E illustrate a configuration of light flux controlling member 132. FIG. 4A is a plan view of light flux controlling member 132, FIG. 4B is a front view of light flux controlling member 132, FIG. 4C is a bottom view of light flux controlling member 132, FIG. 4D is a side view of light flux controlling member 132, and FIG. 4E is a sectional view taken along line A-A of FIG. 4A.

Light flux controlling member 132 controls the distribution of light emitted from light-emitting element 131. As illustrated in FIGS. 4A to 4E, light flux controlling member 132 includes incidence surface 151, rear surface 152, two reflection surfaces 153, two emission surfaces 154 and two first recesses 155. Note that, in the present embodiment, two flange parts 156 and four leg parts 157 are further provided in addition to the above-mentioned configuration.

Incidence surface 151 allows incidence of light emitted from light-emitting element 131. Incidence surface 151 is disposed on the rear side (light-emitting element 131 side) of light flux controlling member 132 in such a manner as to intersect optical axis OA. The shape of incidence surface 151 may be appropriately set as long as the above-mentioned function can be ensured. The shape of incidence surface 151 may be a flat surface, or the inner surface of second recess 158 that opens at rear surface 152. In the present embodiment, the shape of incidence surface 151 is the inner surface of second recess 158 that opens at rear surface 152.

Likewise, the shape of second recess 158 may be appropriately set. In the present embodiment, second recess 158 includes inner top surface 158a (first incidence surface) and inner side surface 158b (second incidence surface). Inner top surface 158a may be composed of one surface, or two or more surfaces. In the present embodiment, inner top surface 158a is composed of two curved surfaces. Inner top surface 158a (first incidence surface) is disposed in such a manner as to intersect optical axis OA. In the present embodiment, inner side surface 158b is composed of two flat surfaces. In the present embodiment, the inner surface (incidence surface 151) of second recess 158 includes two (a pair of) inner top surfaces 158a, and two (a pair of) inner side surfaces 158b opposite to each other in the X-axis direction. Inner side surface 158b (the second incidence surface) connects between inner top surface 158a (first incidence surface) and the opening edge of second recess 158. Second recess 158 may include another surface.

The shape of inner top surface 158a may be a flat surface, or a curved surface. To more easily deliver incident light to two reflection surfaces 153, inner top surface 158a is preferably a curved surface protruding to the rear side in the first virtual cross-section. In the present embodiment, inner top surface 158a is a part of a surface that is rotationally symmetrical about the X axis as the rotation axis. Inner side surface 158b may be a flat surface or a curved surface. In the present embodiment, inner side surface 158b is a flat surface that is parallel to the second virtual cross-section. Inner side surface 158b is also a part of a surface that is rotationally symmetrical about the X axis as the rotation axis. In other words, incidence surface 131 is a part of a surface that is rotationally symmetrical about the X axis as the rotation axis.

Two reflection surfaces 153 are disposed on the side (light diffusion plate 140 side, i.e., the front side) opposite light-emitting element 131 with incidence surface 151 therebetween. In addition, two reflection surfaces 153 reflect at least a part of light entered from at least inner top surface 158a in substantially opposite two directions (along the X axis) that are substantially perpendicular to optical axis OA of light-emitting element 131. In the first virtual cross-section, two reflection surfaces 153 are formed such that as the distance thereof from optical axis OA increases with increasing distance from the X axis. More specifically, in the cross section including optical axis OA of light-emitting element 131, two reflection surfaces 153 are formed such that the gradient of the tangent thereto gradually decreases (the angle to the X axis decreases) from optical axis OA of light-emitting element 131 toward the end portion (emission surface 154). In the present embodiment, two reflection surfaces 153 are a part of a surface that is rotationally symmetrical about the X axis as the rotation axis.

Two emission surfaces 154 are disposed opposite each other in the X-axis direction with two reflection surfaces 153 therebetween. More specifically, two emission surfaces 154 are disposed such that the lower ends thereof are disposed on the X axis. Two emission surfaces 154 emits, to the outside, light entered from inner top surface 158a and reflected by reflection surface 153, and light directly entered from inner side surface 158b. Emission surface 154 may be a flat surface or a curved surface. In the present embodiment, emission surface 154 is a flat surface that is parallel to the second virtual plane. In addition, emission surface 154 may be formed such that, in the second virtual cross-section, emission surface 154 comes closer to the front side with increasing distance from optical axis OA. In the case where emission surface 154 is formed such that emission surface 154 comes closer to the front side with increasing distance from optical axis OA in the second virtual cross-section, light flux controlling member 132 is easily released when light flux controlling member 132 is produced by injection molding. In the present embodiment, two emission surfaces 154 are a part of a surface that is rotationally symmetrical about the X axis as the rotation axis.

Two first recesses 155 refract incident light toward the front side. Two first recesses 155 are disposed with incidence surface 151 therebetween in the X-axis direction, and are open only at rear surface 152. First recess 155 includes first inclined surface 155a and second inclined surface 155b.

First inclined surface 155a is disposed on optical axis OA (central axis CA) side. First inclined surface 155a is disposed such that the distance thereof from optical axis OA increases in the direction toward the front side in the first virtual cross-section. First inclined surface 155a may be a single surface, or a plurality of surfaces. In addition, first inclined surface 155a may be a flat surface or a curved surface. In the present embodiment, first inclined surface 155a is a single curved surface. More specifically, first inclined surface 155a is a part of a surface that is rotationally symmetrical about the X axis as the rotation axis.

Of the angles between optical axis OA and first inclined surface 155a in first virtual cross-section, the smaller angle A1 is not limited as long as angle A1 is greater than 0° such that it functions as a removal taper. However, to refract incident light toward the front side as described above, angle A1 is preferably 10 to 25°, more preferably 15 to 20°. When angle A1 between optical axis OA and first inclined surface 155a is 10° or greater, the light reaching first inclined surface 155a is easily emitted upward. When angle A1 between optical axis OA and first inclined surface 155a is 25° or smaller, total reflection at first inclined surface 155a of the light reaching first inclined surface 155a can be reduced without excessively emitting upward the light reaching first inclined surface 155a.

In the direction along optical axis OA, the front end of first inclined surface 155a is located on the rear side relative to the light that is emitted from the center of light-emitting surface of light-emitting element 131 so as to be entered from incidence surface 151 and is reflected by reflection surface 153 toward emission surface 154. Here, "the front end of first inclined surface 155a" means a point at the most front side in first inclined surface 155a. In addition, the position of the front end of first inclined surface 155a is set on the assumption that the intersections of two inner top surfaces 158a (first incidence surface) and two reflection surfaces 153 are edges, and that "light that is emitted from the center of light-emitting surface of light-emitting element 131 in the direction along optical axis OA" is always reflected by reflection surface 153 toward emission surface 154. As elaborated later, the light that is emitted from the center of the light-emitting surface of light-emitting element 131 so as to be entered from incidence surface 151, and is reflected by reflection surface 153 so as to be emitted from emission surface 154 travels substantially in parallel to substrate 120. As such, when such light impinges on first inclined surface 155a, the quantity of light that travels upward of light-emitting device 130 increases, and a risk of luminance unevenness may be incurred.

On the other hand, the front end of first inclined surface 155a is located on the front side relative to the light that is emitted from an end portion of the light-emitting surface of light-emitting element 131 so as to be entered from incidence surface 151 and directly directed toward emission surface 154 not by way of reflection surface 152. By controlling the light that is emitted from a portion other than the center of the light-emitting surface of light-emitting element 131 so as to be entered from incidence surface 151 and directly directed toward emission surface 154 without using reflection surface 152, the use efficiency of light emitted from light-emitting element 131 can be increased.

Second inclined surface 155b is disposed opposite first inclined surface 155a, and is farther from optical axis OA than first inclined surface 155a. In the first virtual cross-section, second inclined surface 155b is formed such that the distance thereof from optical axis OA increases in the direction toward the rear side (rear surface 152). Second inclined surface 155b may be a single surface, or a plurality of surfaces. In addition, second inclined surface 155b may be a flat surface or a curved surface. In the present embodiment, second inclined surface 155b is a single curved surface. More specifically, second inclined surface 155b is a part of a surface that is rotationally symmetrical about the X axis as the rotation axis.

Of the angles between optical axis OA and second inclined surface 155b in the first virtual cross-section, the smaller angle A2 is preferably 25° or smaller, more preferably 5 to 25°, or still more preferably, 10 to 25° to refract incident light toward the front side with second inclined surface 155b as described above. When angle A2 between optical axis OA and second inclined surface 155b is 5° or greater, the light reaching second inclined surface 155b is easily emitted upward. The degree of upward emission depends on the details of surface light source device 100 such as the size, thickness and the like, and it is therefore preferable to use the angles of both first inclined surface 155a and second inclined surface 155b for the adjustment. On the other hand, when angle A2 between optical axis OA and second inclined surface 155b is 25° or smaller, excessive upward emission of the light reaching second inclined surface 155b can be prevented.

The A1 and the A2 are appropriately adjusted to adjust the illuminance distribution and/or the range of the irradiation region in accordance with the thickness and/or the size of surface light source device 100.

Two emission surfaces 154 are disposed radially outside in such a manner as to connect rear surface 152 and reflection surface 154. Emission surface 154 emits, to the outside, light entered from incidence surface 151. In the first virtual cross-section, emission surface 154 is a surface that is substantially parallel to optical axis OA. In addition, emission surface 154 may be a flat surface or a curved surface. The "substantially parallel to optical axis OA" means that, in the first virtual cross-section, a smaller angle D3 of the two angles between optical axis OA and emission surface 154 is 0 to 3° or smaller. Note that, in the case where emission surface 154 is a curved surface, the D3 is a smaller angle of the angles between optical axis OA and the tangent to the curve of emission surface 154 in the first virtual cross-section. In the present embodiment, emission surface 154 is a flat surface that is formed such that the distance thereof from optical axis OA increases in the direction toward the rear side. More specifically, emission surface 153 is a part of a surface that is rotationally symmetrical about the X axis as the rotation axis.

Two flange parts 156, which are located between two reflection surfaces 153 in a region near optical axis OA, protrude in the Y-axis direction with respect to optical axis OA. Flange part 156 eases handling and alignment of light flux controlling member 132. Note that flange part 156 may have a shape that allows control and emission of light incident on flange part 156.

Four leg parts 157 are substantially columnar members that protrude rearward from rear surface 152. Leg parts 157 support light flux controlling member 132 at an appropriate position with respect to light-emitting element 131 (see FIG. 3B). Leg parts 157 may be used for positioning by fitting leg parts 157 in holes formed in substrate 120. In addition, the position, shape and number of leg parts 157 may be appropriately set as long as light flux controlling member 132 can be stably fixed to substrate 120 such that optically negative influence is avoided. In the present embodiment, two leg parts 157 are disposed between incidence surface 151 and each first recess 155 in the X-axis direction, that is, four leg parts 157 are provided in total.

Note that the edge portion where surfaces are connected to each other may be provided with a slight R-shape in the product in view of creating, shaping, or optical characteristics of metal molds. In particular, in the case where a portion represented by a line segment intersecting optical axis OA of light-emitting element 131 is a complete edge (R0), a region immediately above the light-emitting device is darkened in terms of optical characteristics, and it is therefore preferable to provide an R-shape of about R0.05 to 0.07 to supplement the brightness.

Modification 1

Next, Modification 1 of the present embodiment is described with reference to FIGS. 5A to 5E. The surface light source device according to Modification 1 differs from surface light source device 100 according to Embodiment 1 only in the configuration of light flux controlling member 232. Therefore, light flux controlling member 232 is mainly described below.

Figure 5A:
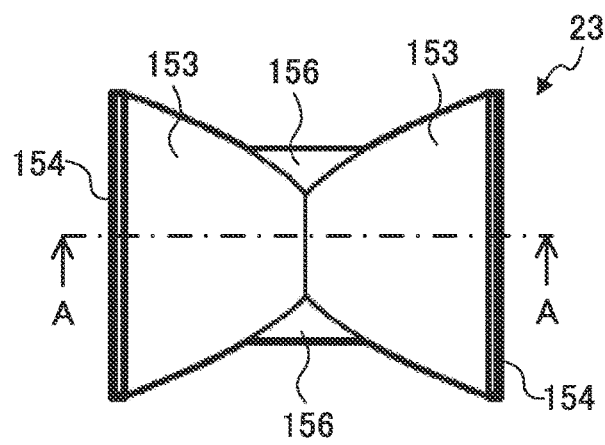
FIGS. 5A, 5B, 5C, 5D and 5E illustrate a configuration of a light flux controlling member according to Modification 1 of Embodiment 1.
Figure 5B:
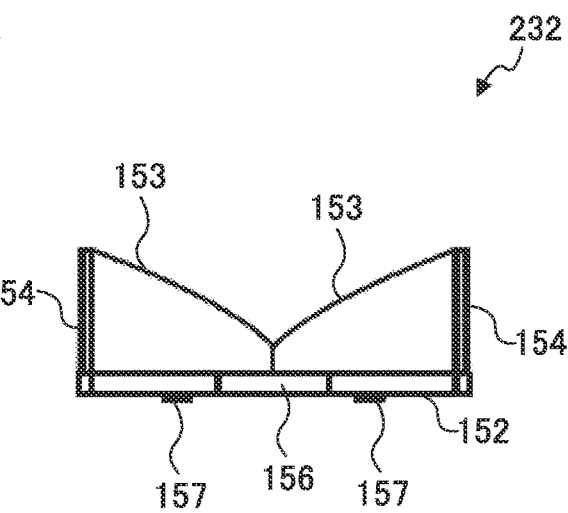
Figure 5C:
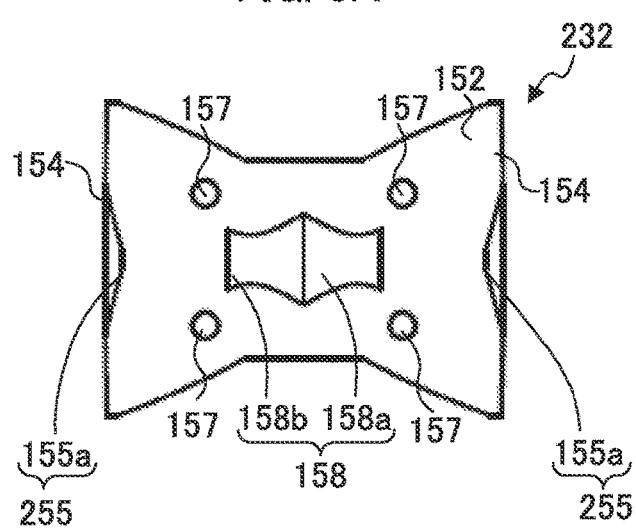
Figure 5D:
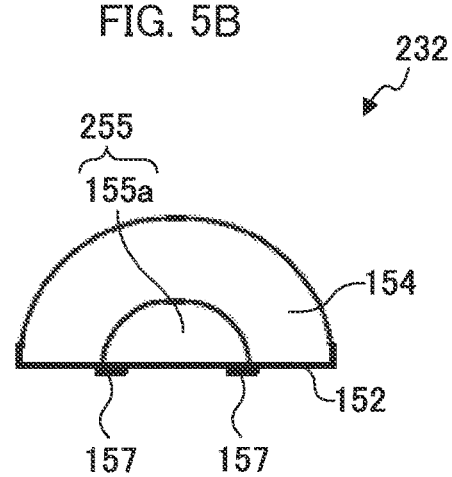
Figure 5E:
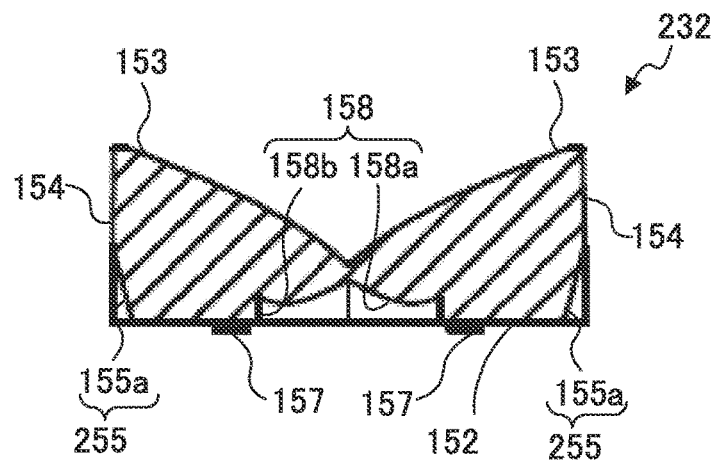

FIGS. 5A to 5E illustrate a configuration of light flux controlling member 232 according to Modification 1 of Embodiment 1. FIG. 5A is a plan view of light flux controlling member 232, FIG. 5B is a front view of light flux controlling member 232, FIG. 5C is a bottom view of light flux controlling member 232, FIG. 5D is a side view of light flux controlling member 232, and FIG. 5E is a sectional view taken along line A-A of FIG. 5A.

Light flux controlling member 232 according to Modification 1 includes incidence surface 151, rear surface 152, reflection surface 153, emission surface 154, and first recess 255. In light flux controlling member 232 according to Modification 1, first recess 255 is open not only at rear surface 152, but also at emission surface 254. As such, first inclined surface 155a also functions as a part of emission surface 254.

Light Distribution Characteristics

Light paths in light-emitting device 130 according to Embodiment 1 and light-emitting device 230 according to Modification 1 are described. In addition, for comparison, light paths in light-emitting device 530 according to a comparative example are also described.

Figure 6A:
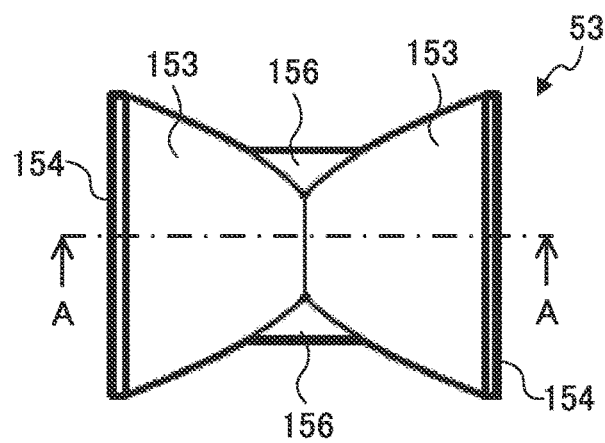
FIGS. 6A, 6B, 6C, 6D and 6E illustrate a configuration of a light flux controlling member of comparative example.
Figure 6B:
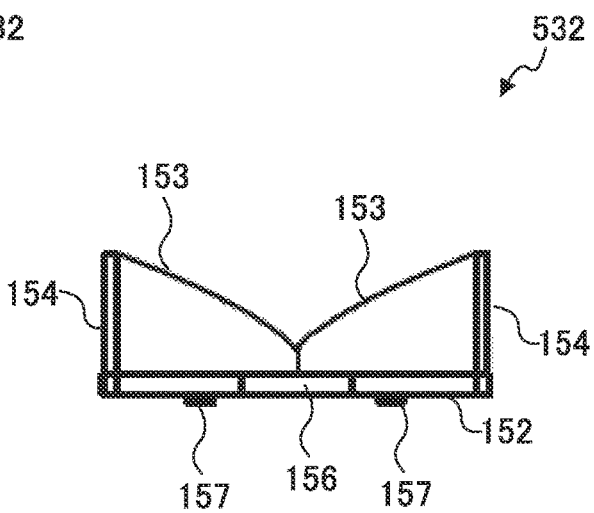
Figure 6C:
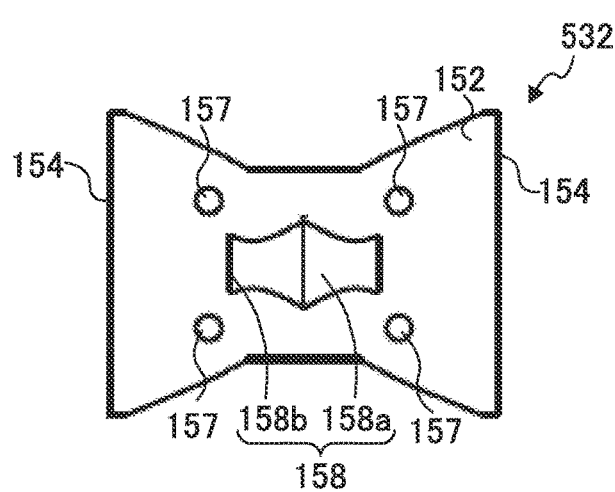
Figure 6D:
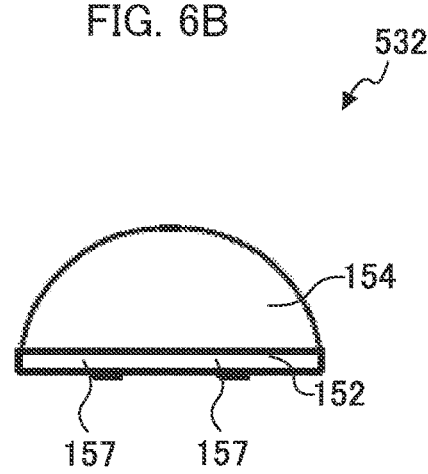
Figure 6E:
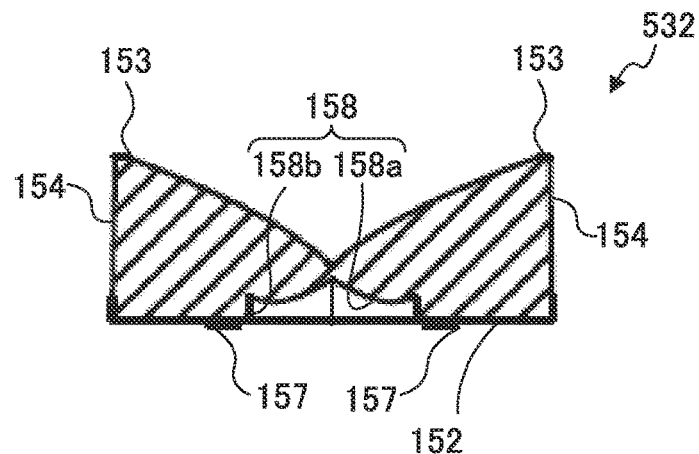

FIGS. 6A to 6E illustrate a configuration of light flux controlling member 532 in light-emitting device 530 of a comparative example. FIG. 6A is a plan view of light flux controlling member 532, FIG. 6B is a front view of light flux controlling member 532, FIG. 6C is a bottom view of light flux controlling member 532, FIG. 6D is a side view of light flux controlling member 532, and FIG. 6E is a sectional view taken along line A-A of FIG. 6A.

As illustrated in FIGS. 6A to 6E, light flux controlling member 532 in light-emitting device 530 of the comparative example includes incidence surface 151, rear surface 152, reflection surface 153, and emission surface 154. That is, light flux controlling member 532 in light-emitting device 530 of the comparative example is identical to light flux controlling member 132 of light-emitting device 100 according to Embodiment 1 except that first recesses 155 is not provided.

Figure 7A:
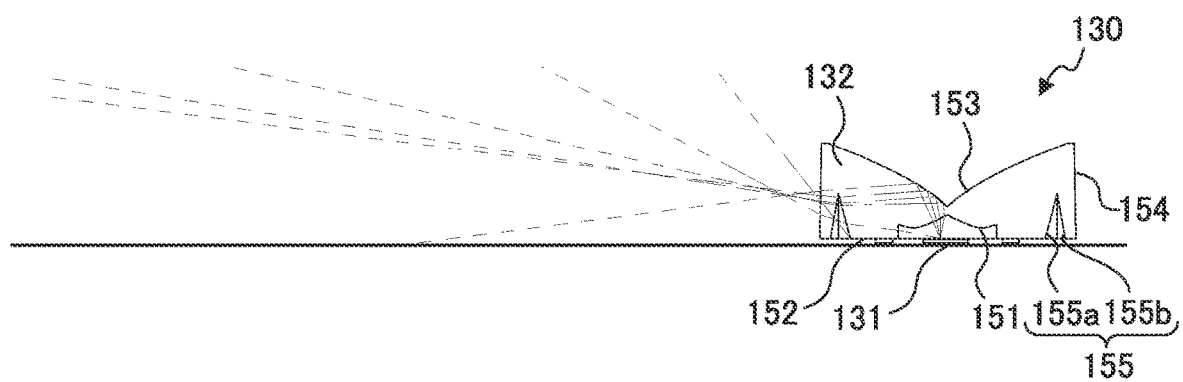
FIGS. 7A, 7B and 7C partially illustrate light paths in a light-emitting device.
Figure 7B:
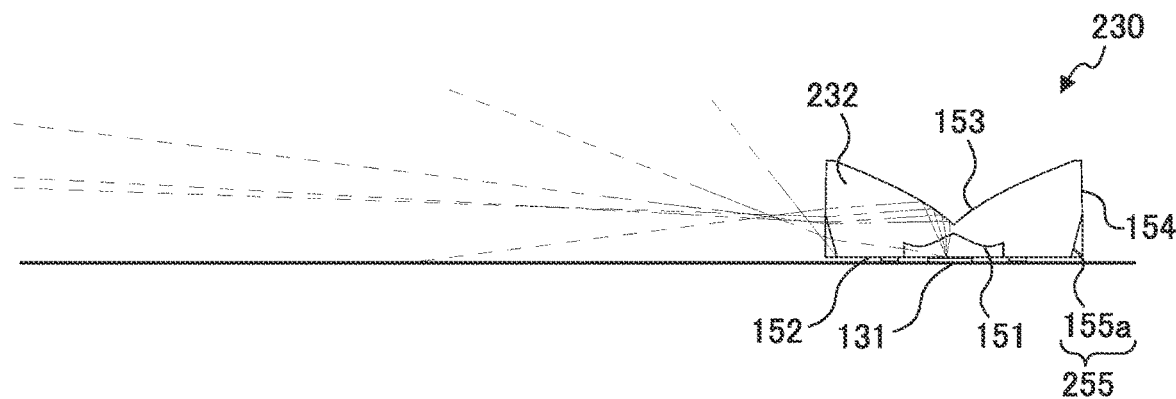
Figure 7C:
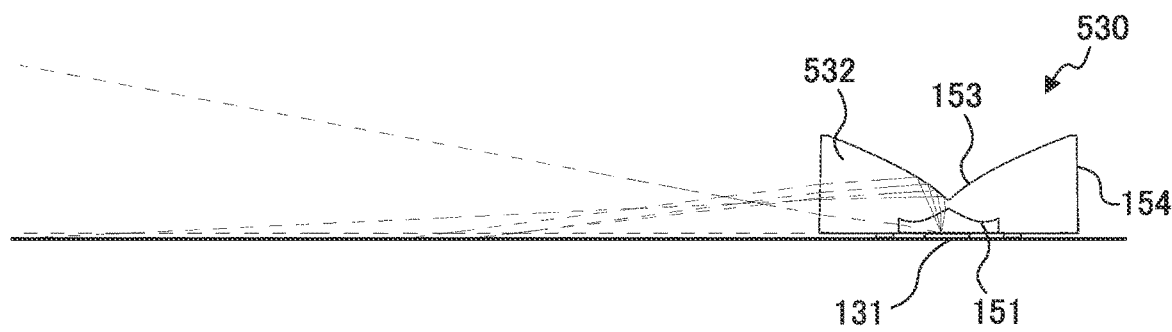

FIGS. 7A to 7C illustrate light paths of light-emitting devices 130, 230 and 530. FIG. 7A illustrates light paths of light-emitting device 130 according to Embodiment 1, FIG. 7B illustrates light paths of light-emitting device 230 according to Modification 1, and FIG. 7C illustrates light paths of light-emitting device 530 according to the comparative example. FIGS. 7A to 7C only partially illustrate the light paths to describe the effect of first recesses 155 and 255. FIGS. 7A to 7C illustrate light paths of light emitted from portions (end portions) other than the center of light-emitting surface of light-emitting element 131.

As illustrated in FIG. 7A, in light-emitting device 130 according to Embodiment 1, light emitted from light-emitting element 131 is entered from incidence surface 151. A part of light entered from incidence surface 151 (inner top surface 158a) is reflected by two reflection surfaces 153 so as to travel in substantially opposite two directions that are substantially perpendicular to optical axis OA of light-emitting element 131, and reach first inclined surfaces 155a of two first recesses 155. On the other hand, a part of the light entered from incidence surface 151 (inner side surface 158b) directly reaches first inclined surfaces 155a of two first recesses 155 not by way of other surfaces. Since first inclined surface 155a is formed such that the distance thereof from optical axis OA increases in the direction toward the front side, the light entered from incidence surface 151 so as to reach thereto through reflection surface 153 and the light entered from incidence surface 151 (inner side surface 158b) so as to directly reach thereto are refracted upward and once emitted out of light flux controlling member 132 (see FIG. 7A). Next, first the light refracted by inclined surface 155a reaches second inclined surface 155b. Since second inclined surface 155b is formed such that the distance thereof from optical axis OA increases in the direction toward the rear side, the light reaching second inclined surface 155b is refracted upward and reentered into light flux controlling member 132. The light reentered into light flux controlling member 132 is emitted upward from emission surface 154 to the outside of light flux controlling member 132. Thus, the quantity of light that is emitted downward from emission surface 154 can be reduced, and the quantity of light that is reflected by the surface of substrate 120 can be reduced. As a result, since the light passed through first recess 155 appropriately emitted toward the front side, the region in the proximity of light-emitting device 130 is not excessively brightened, and light emitted from emission surface 154 easily reach remote regions, and thus, luminance unevenness can be reduced.

In addition, as illustrated in FIG. 7B, in light-emitting device 230 according to Modification 1, the light emitted from light-emitting element 131 is entered from incidence surface 151. A part of the light entered from incidence surface 151 is reflected by two reflection surfaces 153 so as to travel in substantially opposite two directions that are substantially perpendicular to optical axis OA of light-emitting element 131, and then reaches first inclined surfaces 155a of two first recesses 255. On the other hand, another part of the light entered from incidence surface 151 directly reaches first inclined surfaces 155a of two first recesses 155 not by way of other surfaces. First inclined surface 155a is formed such that the distance thereof from optical axis OA increases in the direction toward the front side, and therefore the light entered from incidence surface 151 so as to reach thereto through reflection surface 153 and the entered from incidence surface 151 so as to directly reach thereto are refracted upward and emitted out of light flux controlling member 232 (see FIG. 7B).

As illustrated in FIG. 7C, in light-emitting device 530 of the comparative example, the light emitted from light-emitting element 131 is entered from incidence surface 151. A part of the light entered from incidence surface 151 is reflected by two reflection surfaces 153 so as to travel in substantially opposite two directions that are substantially perpendicular to optical axis OA of light-emitting element 131, and then reaches two emission surfaces 154. On the other hand, another part of the light entered from incidence surface 551 directly reaches two emission surfaces 154. The above-mentioned light having reached two emission surfaces 154 are emitted from two emission surfaces 154. Two emission surfaces 154 are substantially parallel to optical axis OA, and do not include first inclined surface 155a (see FIG. 7C). Accordingly, a part of the light emitted from emission surface 154 travels downward, and tends to be reflected by the surface of a reflection sheet in the case where the reflection sheet is disposed around substrate 120, or by the surface of substrate 120 in the case where substrate 120 has a large area. As a result, the diffusely reflected light tends to reach the illuminated surface in a region around a portion immediately above light-emitting device 530, and a region around light-emitting device 530 is excessively brightened, and consequently, luminance unevenness is easily caused.

Simulation 1

In Simulation 1, the illuminance distribution on light diffusion plate 140 was examined with surface light source device 100 according to Embodiment 1, and a surface light source device including light-emitting device 230 according to Modification 1. The light paths and the illuminance distribution on light diffusion plate 140 were analyzed using surface light source device 100 in which only one light-emitting element 131 is turned on. In addition, for comparison, the illuminance distribution on the light diffusion plate was examined with a surface light source device including comparative light-emitting device 530.

Parameters

Outer Diameter of Light Flux Controlling Member: 18 mm in length in X axis, and 14.3 mm in length in Y axis Height of Light Flux Controlling Member: 6.8 mm Size of Entire Light-emitting Element: substantially square shape with each side of 1.6 mm Distance between Substrate 120 and Light Diffusion Plate 140: 30 mm Angle between Horizontal Surface 111 and First Inclined surface 112: 7°

Figure 8:
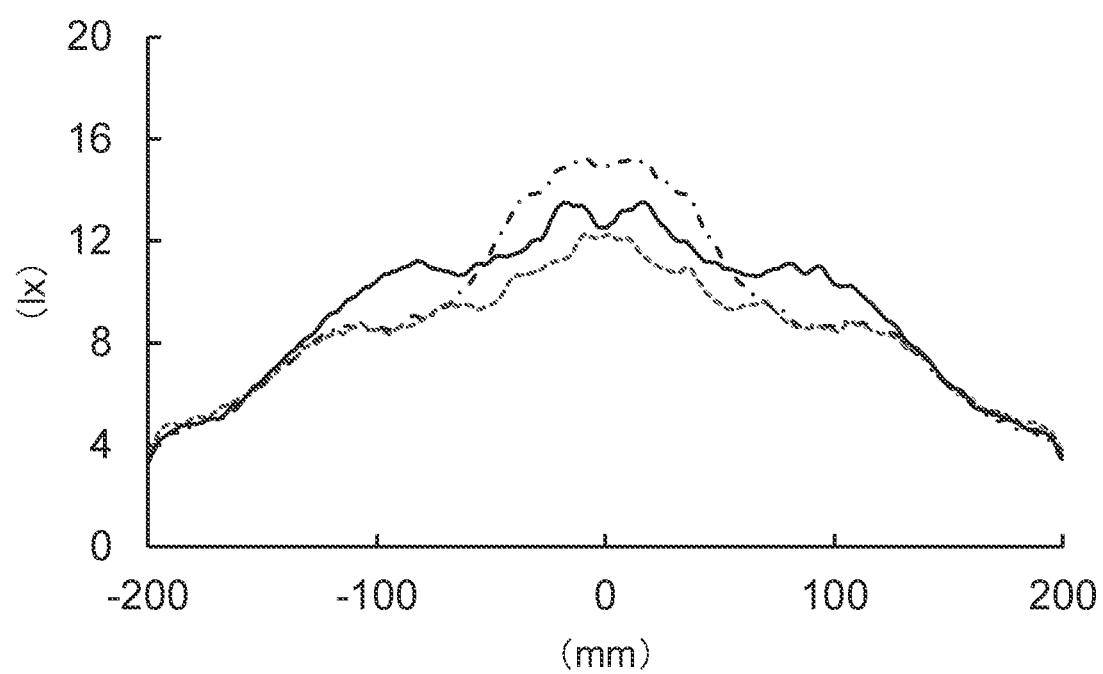
FIG. 8 is a graph illustrating a result of an illuminance distribution on a light diffusion plate.

FIG. 8 is a graph illustrating the illuminance distribution on light diffusion plate 140 in the first virtual cross-section in surface light source device 100 according to Embodiment 1, the surface light source device including light-emitting device 230 according to Modification 1, and the surface light source device including the comparative light-emitting device. In the graph, the abscissa indicates the distance (X-axis direction distance; mm) from optical axis OA of light-emitting element 131 in light diffusion plate 140, and the ordinate indicates the illuminance in light diffusion plate 140. The solid line indicates the results obtained with surface light source device 100 according to Embodiment 1, the dotted line indicates results obtained with the surface light source device of Modification 1, and the dashed line indicates the results obtained with the comparative surface light source device.

As described above, in surface light source device 100 according to Embodiment 1, a large part of the light emitted from the emission surface 154 appropriately travels upward. As a result, as the solid line indicates in FIG. 8, luminance unevenness can be reduced without excessively brightening the region around light-emitting device 130 (the region in the range of −70 mm to 70 mm from optical axis OA). In addition, it was confirmed that a small peak occurs in the region in the range of about ±80 mm from optical axis OA. As a result, as viewed in the entirety of light diffusion plate 140, the illuminance in the region in the range of ±100 mm from optical axis OA is further equalized.

In addition, as described above, it was confirmed that, in the surface light source device according to Modification 1, a large part of the light emitted from the emission surface 154 appropriately travels upward although not as much as surface light source device 100 according to Embodiment 1. As a result, as the dotted line indicates in FIG. 8, illuminance unevenness can be reduced without excessively brightening the region around light-emitting device 130 (the region in the range of −70 mm to 70 mm from optical axis OA).

On the other hand, in the comparative surface light source device, a large part of the light emitted from emission surfaces 154 of light flux controlling member 532 travels downward. The light emitted from emission surfaces 154 of light flux controlling member 532 is reflected by the surface of substrate 120. As a result, as the dashed line indicates in FIG. 8, it was confirmed that luminance unevenness is caused while excessively brightening the region around light-emitting device 530 (the region in the range of −70 mm to 70 mm from optical axis OA).

Simulation 2

In this simulation, light paths of light emitted from the center of the light-emitting surface of light-emitting element 131, and light emitted from an end portion of the light-emitting surface were examined. In some situation, in light-emitting element 131 composed of an LED or the like, the color appearance of light emitted from a center portion of a light-emitting surface, and the color appearance of light emitted from an end portion of light-emitting surface may differ from each other. Consequently, color unevenness may be caused on light diffusion plate 140 when the light beams emitted from light-emitting element 131 are not mixed before reaching light diffusion plate 140.

Figure 9A:
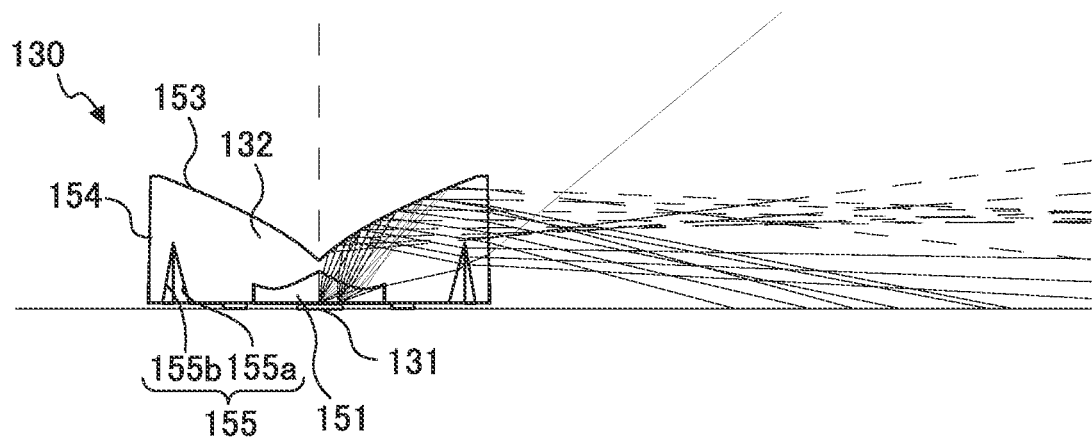
FIGS. 9A, 9B and 9C illustrate light paths of light emitted from a center portion and an end portion of a light-emitting surface of a light-emitting element.
Figure 9B:
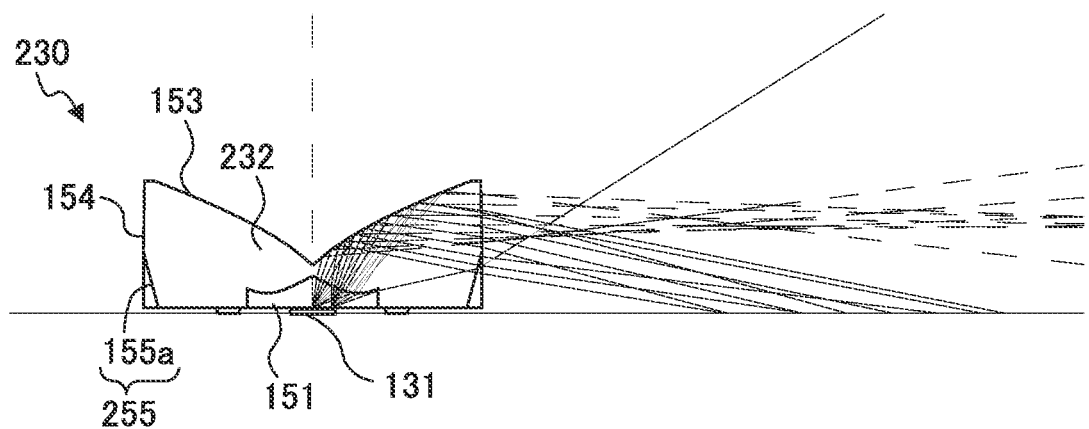
Figure 9C:
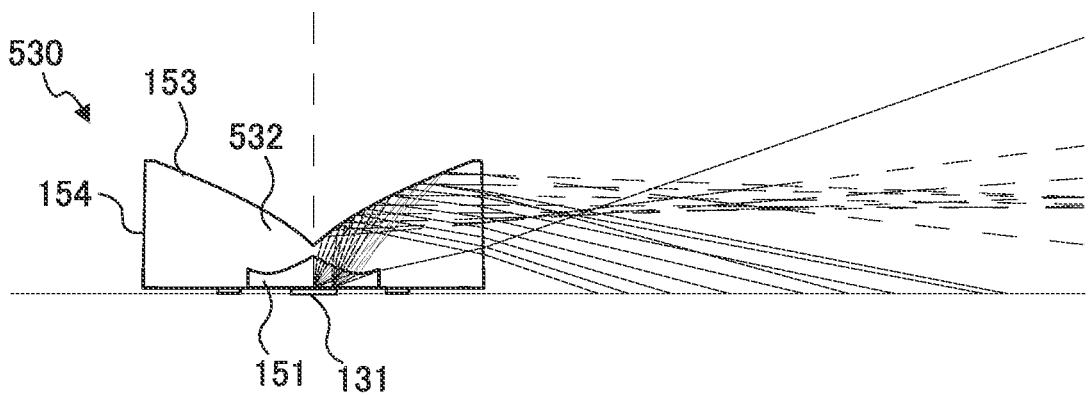

FIGS. 9A to 9C illustrate light paths of light emitted from a center portion and an end portion of the light-emitting surface of a light-emitting element. FIG. 9A illustrates light paths in light-emitting device 130 according to Embodiment 1, FIG. 9B illustrates light paths in light-emitting device 230 according to Modification 1, and FIG. 9C illustrates light paths in the comparative surface light source device. Note that, in FIGS. 9A to 9C, the light paths are partially illustrated for the purpose of clearly illustrating the light paths of the light emitted from a center portion and an end portion of the light-emitting surface of the light-emitting element. In addition, in FIGS. 9A to 9C, the broken line indicates the light emitted from a center portion of the light-emitting surface, and the solid line indicates the light emitted from an end portion of the light-emitting surface.

As illustrated in FIG. 9A, in light-emitting device 130 according to Embodiment 1, a part of the light emitted from an end portion of the light-emitting surface of light-emitting element 131 is controlled by first recess 155 (first inclined surface 155a and second inclined surface 155b) so as to travel in substantially parallel to substrate 120, and thus the light beams emitted from a center portion and an end portion of the light-emitting surface of the light-emitting element are mixed. Thus, color unevenness on light diffusion plate 140 less occurs.

As illustrated in FIG. 9B, in light-emitting device 230 according to Modification 1, a part of the light emitted from an end portion of the light-emitting surface of light-emitting element 131 is controlled by first recess 255 (first inclined surface 155a) so as to travel to reach substrate 120 remote from light-emitting device 230 although not as much as light-emitting device 130 according to Embodiment 1, and the light beams emitted from a center portion and an end portion of the light-emitting surface of the light-emitting element are mixed. Accordingly, color unevenness on light diffusion plate 140 less occurs.

As illustrated in FIG. 9C, in light-emitting device 530 according to the comparative example, a part of the light emitted from an end portion of the light-emitting surface of light-emitting element 131 is emitted from emission surface 154 to a region near light-emitting device 530, the light beams emitted from a center portion and an end portion of the light-emitting surface of the light-emitting element are less mixed. Consequently, color unevenness on light diffusion plate 140 may occur.

Effect

As described above, light flux controlling members 132 and 232 of light-emitting devices 130 and 230 according to Embodiment 1 include first recesses 155 and 255. With this configuration, a large part of the light emitted from first inclined surface 155a can be refracted upward, and thus the quantity of downward emission light can be reduced. Accordingly, the light can be easily delivered to a remote region without excessively brightening the region near light-emitting device 130, and thus luminance unevenness can be reduced. In addition, light-emitting device 130 according to Embodiment 1 can eliminate color unevenness on light diffusion plate 140.

Embodiment 2

Next, a surface light source device according to Embodiment 2 is described. The surface light source device according to Embodiment 2 is different from surface light source device 100 according to Embodiment 1 in the position of the light-emitting device, and the configuration of light flux controlling member 632. As such, the components similar to those of the surface light source device according to Embodiment 1 are designated with the same reference signs, and the description thereof will be omitted.

Configuration of Surface Light Source Device

Although not illustrated in the drawings, the surface light source devices according to the present embodiment are disposed on light-emitting device substrate 120 in a matrix.

In the case where a plurality of light-emitting devices are disposed in a matrix, the ratio of the center-to-center distance (pitch) of the light-emitting devices in the X-axis direction and the center-to-center distance (pitch) of the light-emitting devices in the Y-axis direction is about 1:1, for example.

Configuration of Light Flux Controlling Member

Figure 10A:
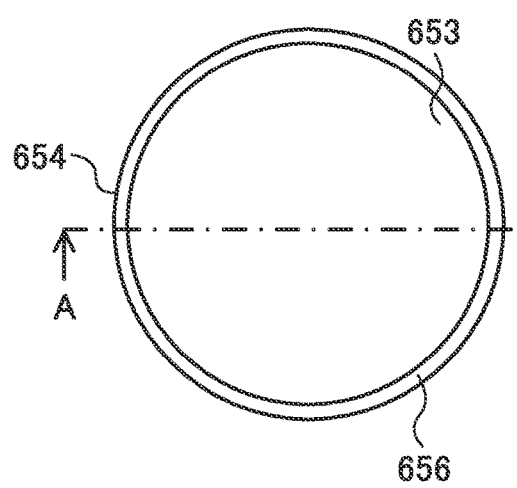
FIGS. 10A, 10B, 10C and 10D illustrate a configuration of a light flux controlling member according to Embodiment 2.
Figure 10B:
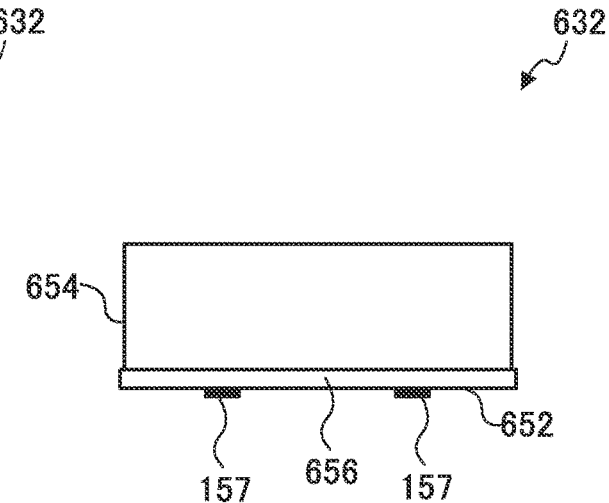
Figure 10C:
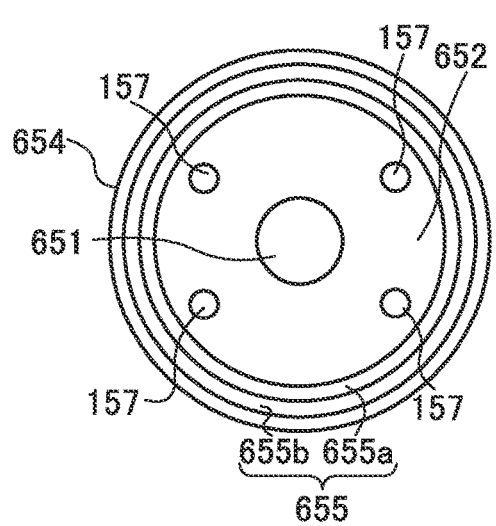
Figure 10D:
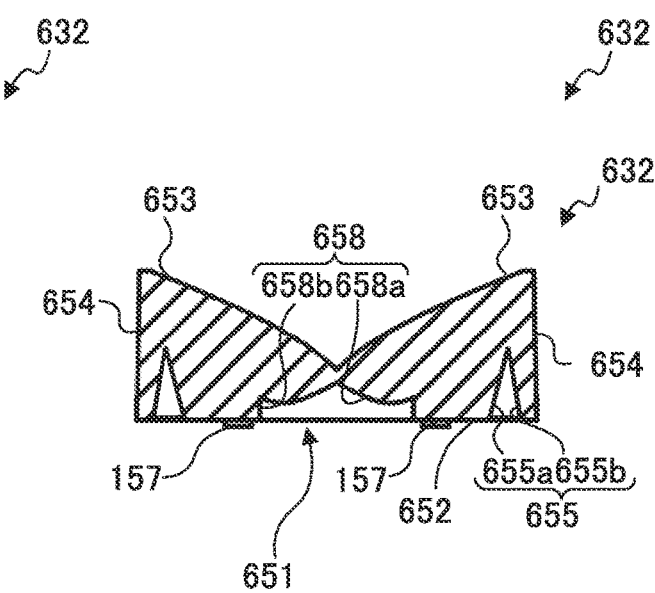
Figure 11:
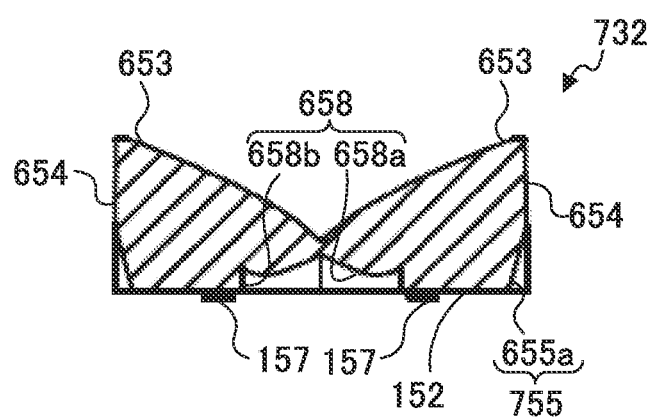
FIG. 11 is a sectional view of a light flux controlling member according to Modification 2 of Embodiment 2.

FIGS. 10A to 10D illustrate a configuration of light flux controlling member 632 according to Embodiment 2. FIG. 10A is a plan view of light flux controlling member 632 according to Embodiment 2, FIG. 10B is a front view of light flux controlling member 632, FIG. 10C is a bottom view of light flux controlling member 632, FIG. 10D is a sectional view taken along line A-A of FIG. 5A, and FIG. 11 is a diagram of light flux controlling member 732 according to Modification 2 of Embodiment 2 in a cross section including central axis of OA.

As illustrated in FIGS. 10A to 10D, light flux controlling member 632 according to the present embodiment includes incidence surface 651, rear surface 652, reflection surface 653, emission surface 654 and first recess 655. Note that, in the present embodiment, flange part 656 and four leg parts 157 are provided in addition to the above-mentioned configurations.

Incidence surface 651, reflection surface 653, emission surface 654 and first recess 655 are circularly symmetrical about optical axis OA as the rotation axis.

The shape of incidence surface 651 may be a flat surface, or the inner surface of second recess 658 that opens at rear surface 652. In the present embodiment, the shape of incidence surface 651 is the inner surface of second recess 658. In addition, in the present embodiment, second recess 658 includes one inner top surface 658a and one inner side surface 658b. In the cross section including central axis CA, inner top surface 658a protrudes to the front side at a center portion thereof, and protrudes to the rear side at outer end portions thereof. Inner side surface 658b is formed in a cylindrical shape.

Rear surface 652 is a flat surface that extends radially outward from the outer edge of second recess 658 in such a manner as to surround second recess 658. First recess 655 is formed in rear surface 652.

First recess 655 is an annular groove formed in such a manner as to surround second recess 658 (incidence surface 651). The second recess includes first inclined surface 655a formed in a annular shape, and second inclined surface 655b formed in a annular shape that is disposed radially outside first inclined surface 655a. Emission surface 654 is formed in a cylindrical shape that is parallel to optical axis OA.

In the cross section including central axis CA, first inclined surface 655a is inclined such that the distance thereof from optical axis OA increases in the direction toward the front side inclination, and second inclined surface 655b is inclined such that the distance thereof from optical axis OA increases in the direction toward the rear side. In addition, in the direction along optical axis OA, the front end of first inclined surface 655a is located on the rear side relative to the light that is emitted from the center of light-emitting surface of light-emitting element 131 so as to be entered from incidence surface 651 and reflected by reflection surface 653 toward emission surface 654, and, the front end is located on the front side relative to the light that is emitted from an end portion of the light-emitting surface of light-emitting element 131 so as to be entered from incidence surface 651 and directly directed toward reflection surface 653 not by way of directly emission surface 654.

Note that, as illustrated in FIG. 11, light flux controlling member 732 may not include the second inclined surface of first recesses 755, and may include only first inclined surface 655a.

In addition, although not illustrated in the drawings, the surface light source device according to Embodiment 2 can also easily deliver, to a remote region, the light emitted from emission surface 654, and can therefore reduce luminance unevenness. In addition, the surface light source device according to Embodiment 2 less causes color unevenness on light diffusion plate 140.

Effect

As described above, the surface light source device according to Embodiment 2 has an effect similar to that of surface light source device 100 according to Embodiment 1.

Comparison Between Embodiment 1 and Embodiment 2

Simulation 3

In Simulation 3, arrival positions, on light diffusion plate 140, of light beams emitted from light-emitting element 131 were examined with the surface light source device according to Embodiment 1 and the surface light source device according to Embodiment 2. Light flux controlling member 832 of Modification 3 was used in the surface light source device according to Embodiment 1, and light flux controlling member 932 of Modification 4 was used in the surface light source device according to Embodiment 2. First, light flux controlling member 832 and light flux controlling member 932 are described.

Figure 12A:
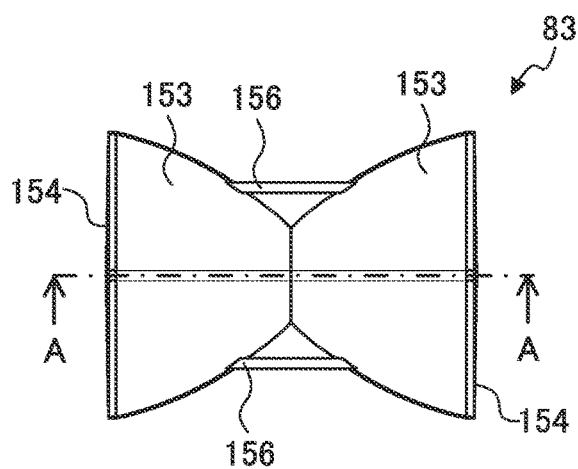
FIGS. 12A, 12B, 12C, 12D, 12E, 12D and 12F illustrate a configuration of a light flux controlling member of Modification 3.
Figure 12B:
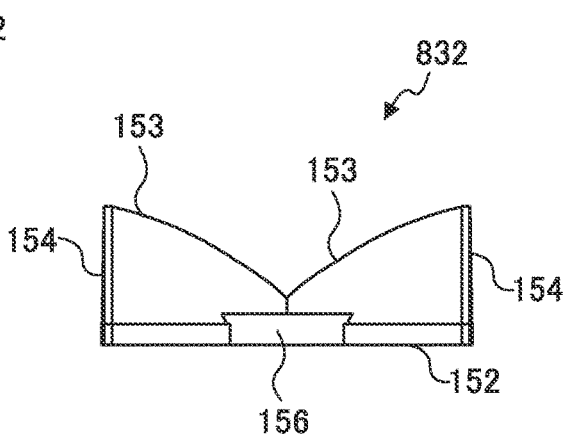
Figure 12C:
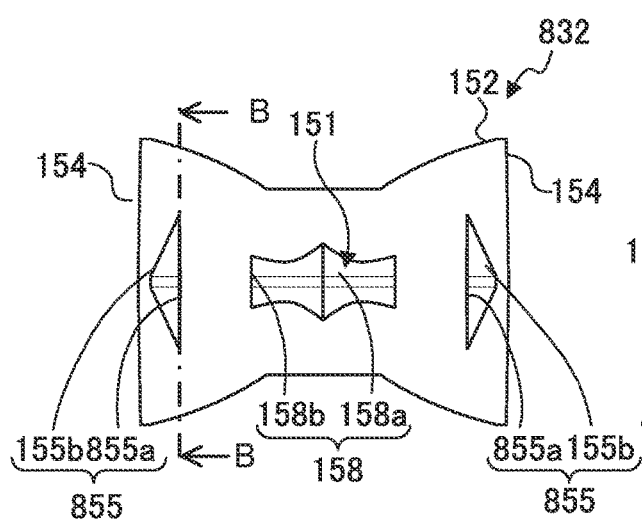
Figure 12D:
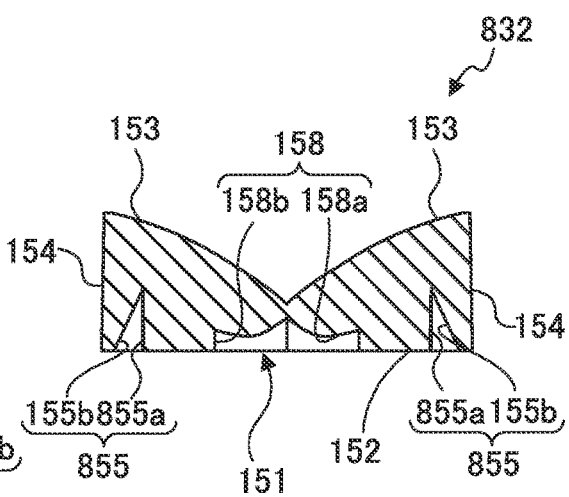
Figure 12E:
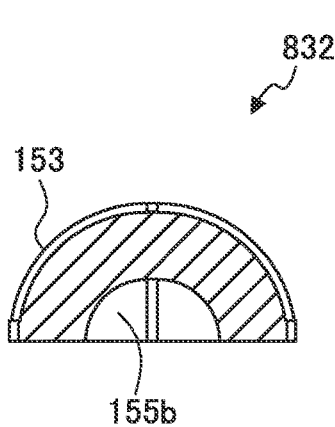
Figure 12F:
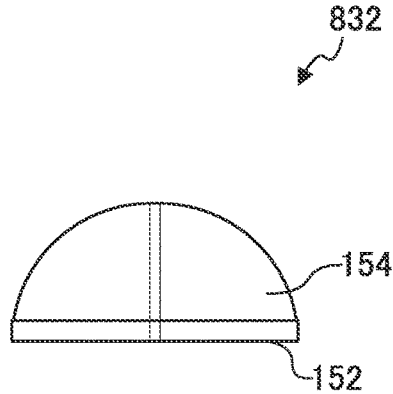

FIGS. 12A to 12F illustrate a configuration of light flux controlling member 832 of Modification 3 used in Simulation 3. FIG. 12A is a plan view of light flux controlling member 832 of Modification 3, FIG. 12B is a front view of light flux controlling member 832, FIG. 12C is a bottom view of light flux controlling member 832, FIG. 12D is a sectional view taken along line A-A of FIG. 12A, FIG. 12E is a sectional view taken along line B-B of FIG. 12C, and FIG. 12F is a right side view of light flux controlling member 832.

As illustrated in FIGS. 12A to 12F, light flux controlling member 832 of Modification 3 used in Simulation 3 includes incidence surface 151, rear surface 152, two reflection surfaces 153, two emission surfaces 154 and two first recesses 855. Light flux controlling member 832 of Modification 3 differs from light flux controlling member 132 of Embodiment 1 in the inclination angle of first inclined surface 855a. The inclination angle of first inclined surface 855a in the present embodiment is substantially an angle of a releasing taper.

Figure 13A:
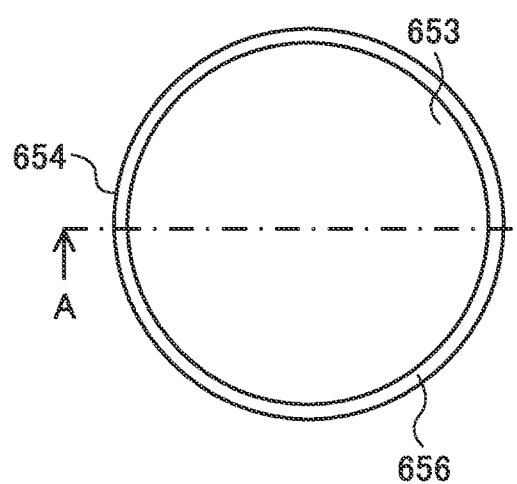
FIGS. 13A, 13B, 13C and 13D illustrate a configuration of a light flux controlling member of Modification 4.
Figure 13B:
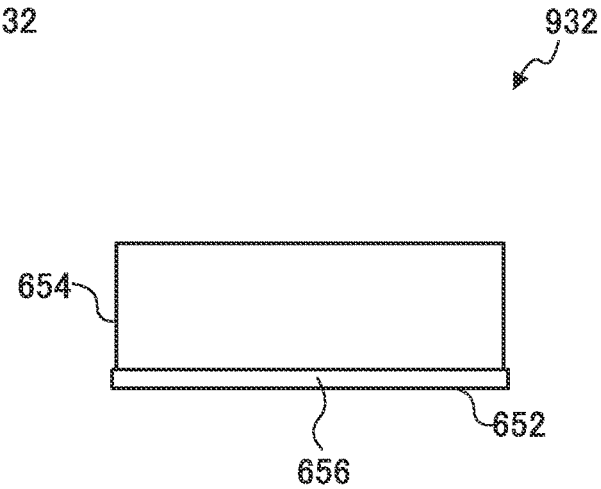
Figure 13C:
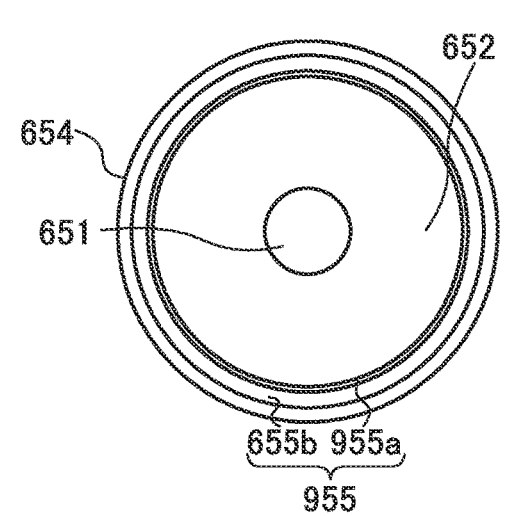
Figure 13D:
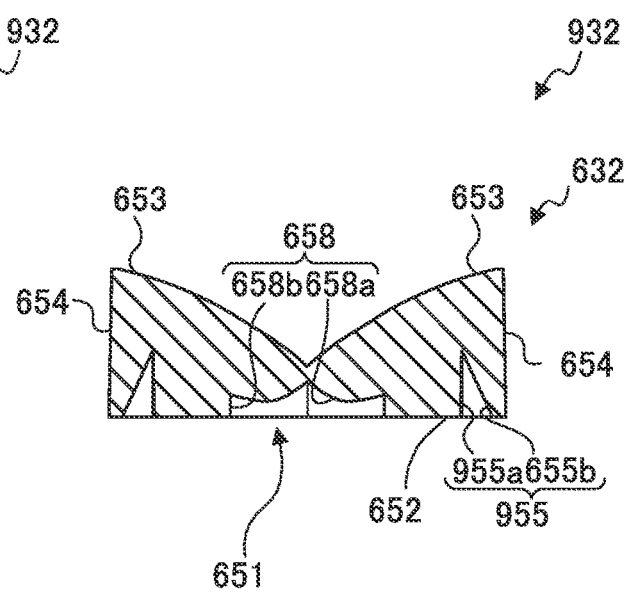

FIGS. 13A to 13D illustrate a configuration of light flux controlling member 932 of Modification 4 used in Simulation 3. FIG. 13A is a plan view of light flux controlling member 932 of Modification 4, FIG. 13B is a front view of light flux controlling member 932, FIG. 13C is a bottom view of light flux controlling member 932, and FIG. 13D is a sectional view taken along line A-A of FIG. 13A.

As illustrated in FIGS. 13A to 13D, light flux controlling member 932 of Modification 4 used in Simulation 3 includes incidence surface 651, rear surface 652, reflection surface 653, emission surface 654 and first recess 955. Light flux controlling member 932 of Modification 4 differs from light flux controlling member 632 of Embodiment 2 in the inclination angle of first inclined surface 955a. The inclination angle of first inclined surface 955a in light flux controlling member 932 of Modification 3 is substantially an angle of a releasing taper. As clearly shown by comparison between FIGS. 12D and 13D, the cross-sectional shape of light flux controlling member 832 of Modification 3 and the cross-sectional shape of light flux controlling member 932 of Modification 4 are identical.

FIGS. 14A to 14G illustrate light paths of light beams in a light-emitting device including light flux controlling member 832 of Modification 3. Each light beam is a light beam emitted from light-emitting element 131 at an angle of 80° with respect to the optical axis of light-emitting element 131. FIG. 14A illustrates a light path of a light beam emitted along the X axis in plan view, FIG. 14B illustrates a light path of a light beam emitted at an angle of 5° with respect to the X axis in plan view, FIG. 14C illustrates a light path of a light beam emitted at an angle of 10° with respect to the X axis in plan view, FIG. 14D illustrates a light path of a light beam emitted at an angle of 15° with respect to the X axis in plan view, FIG. 14E illustrates a light path of a light beam emitted at an angle of 20° with respect to the X axis in plan view, FIG. 14F illustrates a light path of a light beam emitted at an angle of 25° with respect to the X axis in plan view, and FIG. 14G illustrates a light path of a light beam emitted at an angle of 30° with respect to the X axis in plan view.

FIGS. 15A to 15G illustrate light paths of light beams in a light-emitting device including light flux controlling member 932 of Modification 4. Each light beam is a light beam emitted from light-emitting element 131 at an angle of 80° with respect to the optical axis of light-emitting element 131. FIG. 15A illustrates a light path of a light beam emitted along a certain direction in plan view, FIG. 15B illustrates a light path of a light beam emitted at an angle of 5° with respect to the certain direction of FIG. 15A in plan view, FIG. 15C illustrates a light path of a light beam emitted at an angle of 10° with respect to the certain direction of FIG. 15A in plan view, FIG. 15D illustrates a light path of a light beam emitted at an angle of 15° with respect to the certain direction of FIG. 15A in plan view, FIG. 15E illustrates a light path of a light beam emitted at an angle of 20° with respect to the certain direction of FIG. 15A in plan view, FIG. 15F illustrates a light path of a light beam emitted at an angle of 25° with respect to the certain direction of FIG. 15A in plan view, and FIG. 15G illustrates a light path of a light beam emitted at an angle of 30° with respect to the certain direction of FIG. 15A in plan view.

Figure 16:
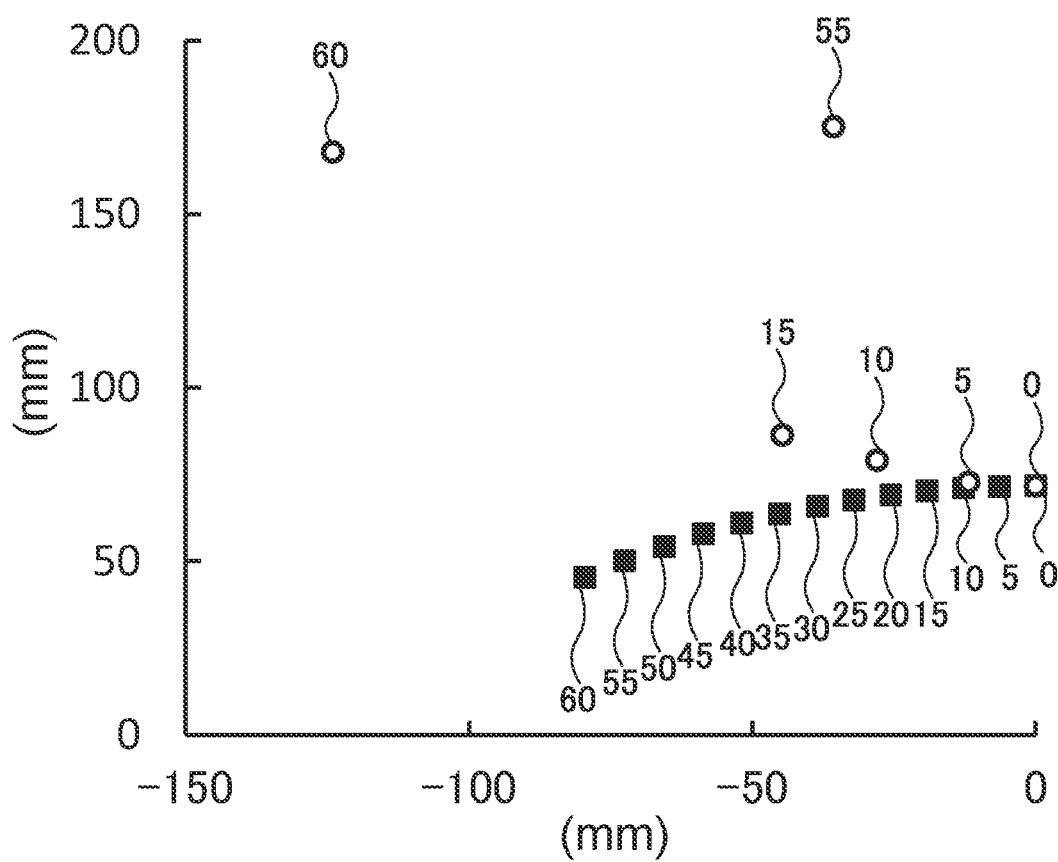
FIG. 16 is a plot of results of FIGS. 14 and 15.

FIG. 16 is a plot of arrival positions, on light diffusion plate 140, of light beams emitted from light-emitting element 131. In FIG. 16, the abscissa indicates the X-directional distance (mm) from the intersection with the optical axis on light diffusion plate 140, and the ordinate indicates the Y-directional distance (mm) from the intersection with the optical axis on light diffusion plate 140. In FIG. 16, white circles indicate arrival positions of light emitted from the light-emitting device including light flux controlling member 832 of Modification 3, and black squares indicate arrival positions of light emitted from the light-emitting device including light flux controlling member 932 of Modification 4. In addition, the number designating each symbol indicates the angle of each light beam emitted from light-emitting element 131 with respect to the X axis.

As shown in FIGS. 14A to 16, comparing the light-emitting device including light flux controlling member 832 of Modification 3 and the light-emitting device including light flux controlling member 932 according to Modification 4, the light-emitting device including light flux controlling member 832 of Modification 3 scatters the light reaching light diffusion plate 140 more than the light-emitting device including the light flux controlling member 932 including according to Modification 4. Conceivably, the reason for this is that a light beam emitted from light-emitting element 131 at a large angle with respect to the X axis does not reach first inclined surface 855a, and the light beam is not refracted toward light diffusion plate 140 side. Thus, the surface light source device using the light-emitting device including the light flux controlling member of Modification 3 causes less luminance unevenness than the surface light source device using the light-emitting device including the light flux controlling member of Modification 4.

This application is entitled to and claims the benefit of Japanese Patent Application No. 2017-159739 filed on Aug. 22, 2017 and Japanese Patent Application No. 2018-150228 filed on Aug. 9, 2018, the disclosure each of which including the specification, drawings and abstract is incorporated herein by reference in its entirety.

INDUSTRIAL APPLICABILITY

The surface light source device including the light flux controlling member according to the present invention is applicable to, for example, a backlight of a liquid crystal display apparatus, a sign, a generally-used illumination apparatuses and the like.

REFERENCE SIGNS LIST

100 Surface light source device
100' Display device
107 Display member
110 Housing
120 Substrate
130, 230, 530 Light-emitting device
131 Light-emitting element
132, 232, 532, 632, 732, 832, 932 Light flux controlling member
140 Light diffusion plate
151, 651 Incidence surface
152, 652 Rear surface
153, 653 Reflection surface
154, 254, 654 Emission surface
155, 255, 655, 755, 855, 955 First recess
155a, 655a, 855a, 955a First inclined surface
155b, 655b Second inclined surface
156, 656 Flange part
157 Leg part
158, 658 Second recess
158a, 658a Inner top surface
158b, 658b Inner side surface

What is claimed is:
1. A light flux controlling member configured to control a distribution of a light-emitting element, the light flux controlling member comprising:
an incidence surface defining an optical axis, the incidence surface being configured to receive light from the light-emitting element;
a rear surface extending radially outward from an outer edge of the incidence surface, the rear surface surrounding the incidence surface,
a reflection surface disposed opposite the rear surface, the reflection surface being configured to reflect light received by the incidence surface,
an emission surface connecting the rear surface and the reflection surface, the emission surface configured to output light received by the incidence surface, and a first recess formed on the rear surface farther from the optical axis than the incidence surface, the first recess includes a first surface inclined towards the reflecting surface with increasing distance from the optical axis, and a front end of the first surface located closer to the rear surface than a center of the emission surface such that a substantial portion of light received by the incidence surface and reflected by the reflection surface does not strike the first surface, and a substantial portion of light received by the incidence surface and not reflected by the reflection surface strikes the first surface.

2. A light-emitting device, comprising:
a light-emitting element defining an optical axis; and
a light flux controlling member configured to control a distribution of light emitted from the light-emitting element, wherein the light flux controlling member includes
an incidence surface disposed to intersect the optical axis, the incidence surface being configured to receive light emitted from the light-emitting element,
a rear surface extending radially outward from an outer edge of the incidence surface, the rear surface surrounding the incidence surface,
a reflection surface opposite the rear surface, the reflection surface being configured to reflect light received by the incidence surface,
an emission surface connecting the rear surface and the reflection surface, the emission surface being configured to output light received by the incidence surface, and
a first recess formed on the rear surface, the first recess being farther from the optical axis than the incidence surface, the first recess including a first inclined surface closer to the front side with increasing distance from the optical axis, and
wherein a front end of the first inclined surface is located such that a substantial portion of light that is emitted from a center region of a light-emitting surface of the light-emitting element and reflected by the reflection surface do not strike the first inclined surface and such that a substantial portion of light that is emitted from peripheral region of the light-emitting surface of the light-emitting element and not reflected by the reflection surface strikes the first inclined surface.

3. The light-emitting device according to claim 2,
wherein the first recess is open also at the emission surface; and
wherein the first inclined surface function also as a part of the emission surface.

4. The light-emitting device according to claim 2,
wherein the first recess is open only at the rear surface, and
wherein the first recess further includes a second inclined surface disposed at a position farther from the optical axis than the first inclined surface, the second inclined surface being inclined such that the second inclined surface comes closer to the rear side with increasing distance from the optical axis.

5. The light-emitting device according to claim 2, wherein each of the reflection surface, the emission surface and the first recess is a part of a rotationally symmetrical surface that is rotationally symmetrical about a straight line as a rotation axis located on the rear side relative to the incidence surface, the straight line being perpendicular to the optical axis.

6. The light-emitting device according to claim 2, wherein each of the incidence surface, the reflection surface, the emission surface and the first recess is circularly symmetrical about the optical axis as a rotation axis.

7. The light-emitting device according to claim 2, wherein the incidence surface is an inner surface of a second recess that is open at the rear surface to intersect the optical axis.

8. The light-emitting device according to claim 4, wherein the incidence surface includes a first incidence surface disposed to intersect the optical axis, and a second incidence surface connecting the first incidence surface and an opening edge of the second recess.

9. A surface light source device, comprising:
a plurality of the light-emitting devices according to claim 2; and
a light diffusion plate configured to allow the light emitted from the light-emitting device to pass through the light diffusion plate while diffusing the light emitted from the light-emitting device.

10. A display device, comprising:
the surface light source device according to claim 9; and
a display member configured to be irradiated with light emitted from the surface light source device.

* * * * *